US011156459B2

(12) United States Patent
Maspero et al.

(10) Patent No.: US 11,156,459 B2
(45) Date of Patent: Oct. 26, 2021

(54) MICROELECTROMECHANICAL OR/AND NANOELECTROMECHANICAL DEVICE WITH OUT-OF-PLANE DISPLACEMENT HAVING CAPACITIVE ELEMENTS HAVING A VARIABLE SURFACE

(71) Applicant: COMMISSARIAT A L'ENERGIE ATOMIQUE ET AUX ENERGIES ALTERNATIVES, Paris (FR)

(72) Inventors: Federico Maspero, Grenoble (FR); Loic Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 438 days.

(21) Appl. No.: 15/625,314

(22) Filed: Jun. 16, 2017

(65) Prior Publication Data
US 2017/0363424 A1 Dec. 21, 2017

(30) Foreign Application Priority Data
Jun. 17, 2016 (FR) ...................................... 16 55653

(51) Int. Cl.
*G01P 15/125* (2006.01)
*G01C 19/00* (2013.01)
(Continued)

(52) U.S. Cl.
CPC ........ *G01C 19/5762* (2013.01); *B81B 3/0045* (2013.01); *B81B 3/0051* (2013.01);
(Continued)

(58) Field of Classification Search
CPC ........... G01P 15/125; G01P 2015/0825; G01P 2015/0837; G01P 2015/084;
(Continued)

(56) References Cited

U.S. PATENT DOCUMENTS 6,384,952 B1 5/2002 Clark et al.
8,729,770 B1 5/2014 Milanovic
(Continued)

FOREIGN PATENT DOCUMENTS

DE 10 2012 223 016 A1 6/2014
EP 2 599 746 A1 6/2013
(Continued)

OTHER PUBLICATIONS

French Preliminary Search Report dated Mar. 30, 2017 in French Application 16 55653 filed on Jun. 17, 2016 (with English Translation of Categories of cited documents).
(Continued)

*Primary Examiner* — Jill E Culler
*Assistant Examiner* — Ruben C Parco, Jr.
(74) *Attorney, Agent, or Firm* — Oblon, McClelland, Maier & Neustadt, L.L.P.

(57) ABSTRACT

Microelectromechanical sensor comprising a fixed part and a mobile part suspended from the fixed part such that the mobile part can move at least in an out-of-plane displacement direction, the fixed part comprising at least first electrodes extending parallel to the displacement direction of the mobile part, the mobile part comprising a seismic mass and at least second electrodes extending parallel to the out-of-plane displacement direction, the first electrodes and the second electrodes being located relative to each other so as to be interdigitated, in which the second electrodes are directly connected to the inertial mass and only part of the face of each mobile electrode is facing an electrode fixed at rest.

27 Claims, 27 Drawing Sheets

(51) Int. Cl.
*G01C 19/5762* (2012.01)
*B81B 3/00* (2006.01)
*B81C 99/00* (2010.01)
*H01G 5/14* (2006.01)
*G01P 15/08* (2006.01)

(52) U.S. Cl.
CPC .......... *B81B 3/0062* (2013.01); *B81C 99/003* (2013.01); *G01P 15/125* (2013.01); *H01G 5/14* (2013.01); *B81B 2201/0228* (2013.01); *B81B 2201/0242* (2013.01); *B81B 2201/033* (2013.01); *B81B 2203/053* (2013.01); *G01P 2015/0822* (2013.01)

(58) Field of Classification Search
CPC .............. G01P 2015/0842; H01G 5/14; B81B 2201/033; B81B 2203/053
USPC ...................................................... 73/514.32
See application file for complete search history.

(56) References Cited

U.S. PATENT DOCUMENTS

| | | | |
|---|---|---|---|
| 2002/0189355 A1* | 12/2002 | Leonardson | G01L 1/148 73/514.32 |
| 2003/0210511 A1 | 11/2003 | Sakai et al. | |
| 2006/0245027 A1 | 11/2006 | Epitaux | |
| 2009/0308160 A1 | 12/2009 | Je et al. | |
| 2010/0225255 A1 | 9/2010 | Franke | |
| 2010/0236328 A1* | 9/2010 | Akashi | G01C 19/5719 73/504.12 |
| 2011/0182150 A1 | 7/2011 | Cohen et al. | |
| 2016/0138920 A1 | 5/2016 | Kim et al. | |

FOREIGN PATENT DOCUMENTS

| | | |
|---|---|---|
| WO | WO 2006/110304 A1 | 10/2006 |
| WO | WO 2010/038229 A2 | 4/2010 |
| WO | WO 2013/108705 A1 | 7/2013 |

OTHER PUBLICATIONS

French Search Report dated Feb. 19, 2018 in corresponding French Patent Application No. 1755480 (with English Translation of Category of Cited Documents), 4 pages.

Extended European Search Report dated Oct. 19, 2017 in Patent Application No. 17176388.1.

* cited by examiner

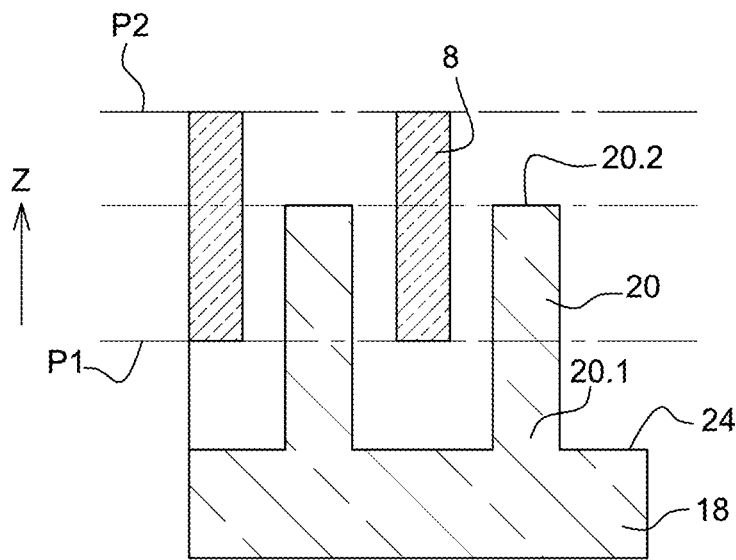
Fig. 2
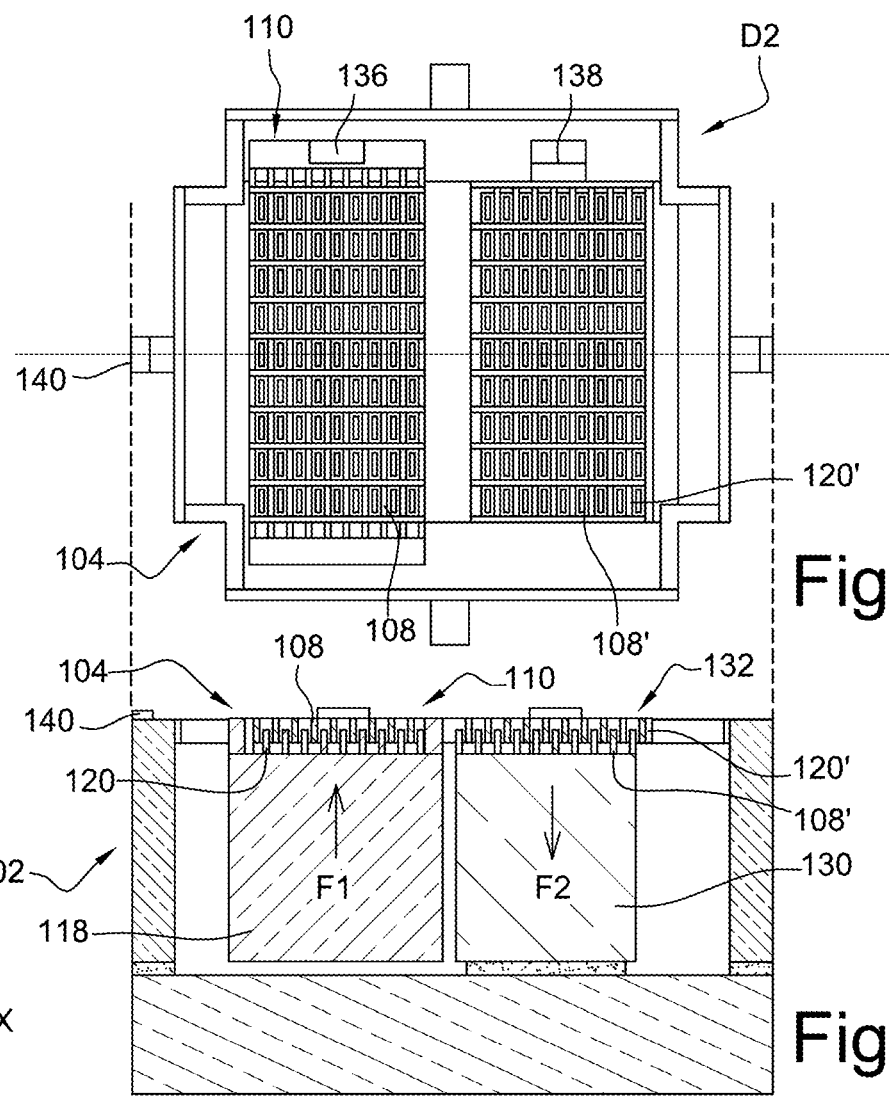
Fig. 3A
Fig. 3B

MICROELECTROMECHANICAL OR/AND NANOELECTROMECHANICAL DEVICE WITH OUT-OF-PLANE DISPLACEMENT HAVING CAPACITIVE ELEMENTS HAVING A VARIABLE SURFACE

TECHNICAL DOMAIN AND STATE OF PRIOR ART

This invention relates to a MEMS and/or NEMS device with out-of-plane movement comprising capacitive means with variation of surface area that can act as a sensor or actuator.

MicroElectroMechanical Systems (MEMS) and NanoElectroMechanical Systems (NEMS) are increasingly present in everyday objects such as smartphone type portable telephones, touch tablets and smart watches. These devices are used as sensors, for example inertial sensors, and as micro- or nanoactuators.

Furthermore, the dimensions of these devices are getting smaller due to mass production of these devices and their integration needs. For example, dimensions have been reduced by a factor of about 10 in recent years.

This size reduction can cause problems. In the case of inertial sensors, the reduction in the inertial mass causes an increase in mechanical noise because it is more affected by Brownian air displacement forces. Furthermore, in the case of capacitive detection that is used in many inertial sensors, one effect of the reduction in the footprint of the sensor is to reduce the static capacitance or the capacitance at rest, making the device more sensitive to parasite capacitances.

In general, capacitive means for detection of in-plane movement comprise interdigitated combs. Out-of-plane detection often takes place only by two facing surfaces, one of the combs being fixed relative to a fixed part and the other comb being fixed to the mobile mass. Relative displacement of the combs can be an air gap variation or a variation in surface area. In the case of an air gap variation, the comb fingers move perpendicular to their surface and the variation of capacitance is due to the variation of the air gap between facing fingers. In the case of a variation in surface area, the fingers move in a direction parallel to the plane of their surface and the variation of capacitance is due to the variation of the surface area of facing fingers. Most capacitive out-of-plane movement detection means are of the air gap variation type. They comprise two facing surfaces perpendicular to the direction of out-of-plane movements, the air gap of which varies as a function of the movements.

There are several disadvantages with capacitive air gap variation devices.

Their resolution and sensitivity are limited due to the non-linearity of the transduction process. They can have a high damping factor due to the air layer that is compressed between facing surfaces, resulting in mechanical noise. There is also an increased risk of facing surfaces sticking together due to the pull-in phenomenon.

It is then preferable to use capacitive means based on surface area variation.

Document US2009/0308160 describes an out-of-plane displacement accelerometer based on capacitive detection by surface area variation. FIG. 12 diagrammatically shows the accelerometer in FIG. 9 of document US2009/0308160. It comprises a mobile part 2001 suspended by springs from a fixed part. The mobile part 2001 comprises a mass 2002 fixed to an electrode support part 2004 by a coupling portion 2009 made of oxide. This accelerometer requires the use of different sized electrodes in order to detect the direction of displacement of the mobile part. The electrode support part 2004 comprises first mobile electrodes 2005 with a first size and second mobile electrodes 2006 with a second size. The fixed part comprises first fixed electrodes 2007 with a first size and second fixed electrodes 2008 with a second size. The electrodes 2005 and 2007 are interdigitated and the electrodes 2006 and 2008 are interdigitated.

The first interdigitated electrodes 2005, 2007 detect only an upwards movement of the mobile part and the second interdigitated electrodes 2006, 2008 detect only a downwards movement of the mobile part. Since these two groups of electrodes are made separately, there are differences between the electrodes that leads to the generation of an asymmetric detection signal, with the result that there is significant non-linearity. The sensitivity is also lower than for a device in which all electrodes participate in detection in both displacement directions.

Furthermore, this accelerometer has a complex structure and construction, the combs are not fixed to the mass directly but are fixed to a support that is itself fixed to the mass by rigid arms. The use of these intermediate elements reduces the surface area available for the electrodes. Furthermore, manufacturing of different sized electrodes is complex.

Furthermore, the mobile part has a significant size, with the result that the accelerometer also has a significant size.

Furthermore, the structure of this accelerometer cannot be used as an out-of-plane actuator because the capacitances reduce regardless of the direction of displacement.

PRESENTATION OF THE INVENTION

Consequently, one purpose of this invention is to disclose a MEMS and/or a NEMS device with out-of-plane movement that can be used as a detection and/or actuation device, comprising capacitive means based on surface area variation that is easy to manufacture and has improved linearity and sensitivity.

The purpose mentioned above is achieved by a MEMS and/or NEMS device comprising at least one first part and one second part free to move relative to each other so that they can move in an out-of-plane direction, the first part comprising at least first electrodes extending parallel to the direction of displacement, the second part comprising a second support and at least second electrodes extending parallel to the direction of displacement of the second part, the first and second electrodes being arranged relative to each other such that they are interdigitated, the second support comprising at least one face perpendicular to the out-of-plane displacement direction, at least part of the second electrodes comprising a first end and a second end in the out-of-plane displacement direction, the second end being directly connected to the face of the second support and the first end being located between two first electrodes such that only part of the face of each first electrode is facing a second electrode at rest.

In the case of an inertial device, the second support is at least partly composed of an inertial mass.

All electrodes participate in detection of the relative displacement of the first and second parts regardless of the direction of displacement, therefore the detection sensitivity is not reduced. Furthermore, for example in the case in which one of the parts is fixed and the other part is mobile, the structure of the device according to the invention can detect the out-of-plane displacement direction of the mobile part even in the case in which the dimensions of all electrodes are the same.

The structure can be simplified.

Furthermore, the entire face of the second support can be occupied by electrodes, and a large density of electrodes can be reached. The device can have a high capacitive density. It also has good linearity and good sensitivity due to detection by surface area variation.

Furthermore, the invention makes it possible to have a high inertial mass and therefore a high inertial force that is advantageous in the case of detection devices. The size of the device can be reduced without reducing its performances. Furthermore, the invention can reduce the inertial mass and therefore make the device even smaller, while keeping similar performances because sensitivity is improved and electronic noise is more subdued, which can compensate for the increase in noise resulting from the reduced inertial mass.

Since electrodes are fixed to the mass directly, the device is more compact. This avoids the use of a cumbersome frame to retain electrodes, and that does not participate directly in operation. The electrodes are also sufficiently rigid because they are short.

In other words, a MEMS and/or NEMS device is made comprising at least two parts free to move relative to each other, in which at least part of the electrodes in one of the parts extends directly from one of the faces of this part. At rest, the electrodes are then offset from the electrodes of the other part along the out-of-plane displacement direction and enable cooperation with the electrodes of the other part, either to detect out-of-plane displacement and the direction of displacement, or to provoke displacement between the two parts by applying a potential difference between the electrodes.

This structure makes it possible to use the device as a detection device, for example as an accelerometer, or as an actuator, for example to move micromirrors.

In one embodiment, the device comprises one assembly comprising a first part and a second part free to move relative to each other and a second assembly comprising a first part and a second part free to move relative to each other, the first part of the first assembly being mechanically connected to the second part of the second assembly and the second part of the first assembly being mechanically connected to the first part of the second assembly.

In one example of a manufacturing method, two layers are used, one to make the mass and the other to make the electrodes. Therefore, a thick layer can be used to obtain a large mass, and a thinner layer can be used to make the electrodes, so that very thin air gaps can be etched.

The subject-matter of the invention is then a microelectromechanical and/or nanoelectromechanical device comprising at least one first part and at least one second part free to move relative to each other at least in an out-of-plane direction, the first part comprising a first support and at least first electrodes extending parallel to the direction of displacement, the second part comprising a second support and at least second electrodes extending parallel to said out-of-plane displacement direction, the first electrodes and the second electrodes being arranged relative to each other such that they are interdigitated, the second support comprising at least one face perpendicular to the direction of out-of-plane displacement, the first electrodes comprising a first end and a second end in the direction of displacement, the second electrodes comprising a first end and a second end in the direction of displacement, in which the second end of the second electrodes is directly connected to the face of the second support and their first end is located between the two ends of the first electrodes such that only part of the face of each second electrode is facing a first electrode at rest.

In one embodiment, at least one of said first or second parts is free to move and the other of said first or second parts is fixed.

In another embodiment, the first and the second parts are both mobile and displace relative to each other.

According to the invention, at least the second electrodes of the second part (either fixed or mobile) are anchored to the second support through their second ends while the first part (either fixed or mobile) may comprise first electrodes suspended from the first support, i.e. their ends are not in direct contact with the first support, or they are anchored, i.e. their ends are in direct contact with the first support.

The first and/or the second parts is/are mobile, at least part of said first and/or said second support can form an inertial mass.

The part of the first support forming an inertial mass can be suspended from the second part and/or the part of the second support forming an inertial mass can be suspended from the first part.

In one advantageous example, the device comprises at least two assemblies, one assembly called the first assembly and one assembly called the second assembly, the first part of the first assembly being mechanically connected to the second part of the second assembly, and the second part of the first assembly being mechanically connected to the first part of the second assembly.

Preferably, the first part of the first assembly and the second part of the second assembly are electrically insulated from each other, and/or the second part of the first assembly and the first part of the second assembly are electrically insulated from each other. This device is capable of making a differential reading.

Advantageously, the second support of the first assembly and the second support of the second assembly are located on one plane perpendicular to the out-of-plane direction, and the first support of the first assembly and the first support of the second assembly are located on another side of said plane.

In another example, the second support forming an inertial mass of the first assembly surrounds the second support of the second assembly, and the first part of the first assembly comprises at least two suspended portions that can be polarised separately and arranged symmetrically on opposite sides of a plane of symmetry of the device containing the direction of the out-of-plane displacement.

In another example, the second support forming the inertial mass of the first assembly comprises four housings to hold four second supports of the second assembly, the second electrodes of the first assembly forming a cross between the four housings, and the second assembly comprises four first supports suspended from the second support of the first assembly.

Advantageously for each assembly, the cross-section of the first electrodes and the second electrodes are such that the first or the second electrodes continuously surround the second and first electrodes respectively.

The device according to the invention can form a capacitive detection device.

The device according to the invention can form an actuator device. The mobile part is for example suspended from the fixed part by a pivot articulation.

Another subject-matter of the invention is a micromirror device comprising at least one actuator according to the invention, the mobile support comprising a second face opposite the first face, comprising a reflecting surface forming a mirror.

The device according to the invention can form a gyrometer comprising at least one device according to the invention forming an actuator and/or a detection device.

The device according to the invention can be made by a method of manufacturing a device according to the invention, starting from a first substrate comprising at least one first layer made of a thick electrically conducting material, comprising the following steps:

a) formation of a sacrificial layer, for example composed of oxide on the first layer made of an electrically conducting material, b) formation of first trenches in the first sacrificial layer as far as the first layer made of an electrically conducting material so as to form islands of the second sacrificial layer, c) formation of a second layer of electrically conducting material on the first sacrificial layer and in the first trenches, d) structuring of said second layer made of an electrically conducting material so as to form second trenches at least partly opening up on islands of a second sacrificial layer, the element thus formed comprising first portions of the second layer of electrically conducting material in contact with the first layer of electrically conducting material and that will form second electrodes and second portions of the second layer of electrically conducting material in contact with islands of the second sacrificial layer, that will form the first electrodes, e) partial etching of the first portions, f) release the structure.

Very advantageously, in step d), the first electrodes are formed by etching stopped on the islands of the second sacrificial layer and the second electrodes are formed by this same etching stopped in time stopping between islands of this second sacrificial layer or beyond in the direction of etching.

Step d) may comprise the formation of a hard mask on the second layer of electrically conducting material, structuring of said hard mask at the locations of the second portions, and the formation of a mask made of a photosensitive resin at the locations of the first portions.

Advantageously, step c) comprises an epitaxial growth step.

In one example embodiment, the method comprises a step between step e) and step f) to fabricate a second substrate provided with a cavity, assembly of the second substrate with the first substrate such that the first and second portions are facing the cavity and fabrication of third trenches in the first substrate starting from the back face and as far as the first sacrificial layer so as to delimit the mobile part.

The method can advantageously comprise a step to assemble a cover on the second substrate.

In another example embodiment, the first substrate is a silicon on insulator substrate and the fabrication method comprises a step before the first step a) in which fourth trenches are formed in the first layer made of an electrically conducting material as far as an oxide layer in the first substrate so as to delimit the mobile part, and in which in step a), the first sacrificial layer is formed on the first layer made of an electrically conducting material so as to cover the first layer made of an electrically conducting material and to at least close off the fourth trenches.

BRIEF DESCRIPTION OF THE DRAWINGS

This invention will be better understood after reading the following description and the appended drawings on which:

FIG. 2 is a detailed view of FIG. 1A, at the electrodes, FIG. 3A is a view of another example embodiment of the MEMS and/or NEMS device according to the invention, FIG. 3B is a sectional view of the device in FIG. 3A along section plane B-B.

DETAILED PRESENTATION OF PARTICULAR EMBODIMENTS

In the following description, the MEMS and/or NEMS device will be referred to as the "device".

In the examples represented, the device comprises a fixed part and a mobile part, but this is not limitative. The device according to the invention could comprise two mobile parts free to move relative to each other at least in an out-of-plane direction, the two parts being suspended from a fixed part.

The relative layout of the mobile part and the fixed part on the figures is in no way limitative and the reverse layout could be envisaged, for example in which the support is located above the fixed electrodes.

Figures 1A, 1B:
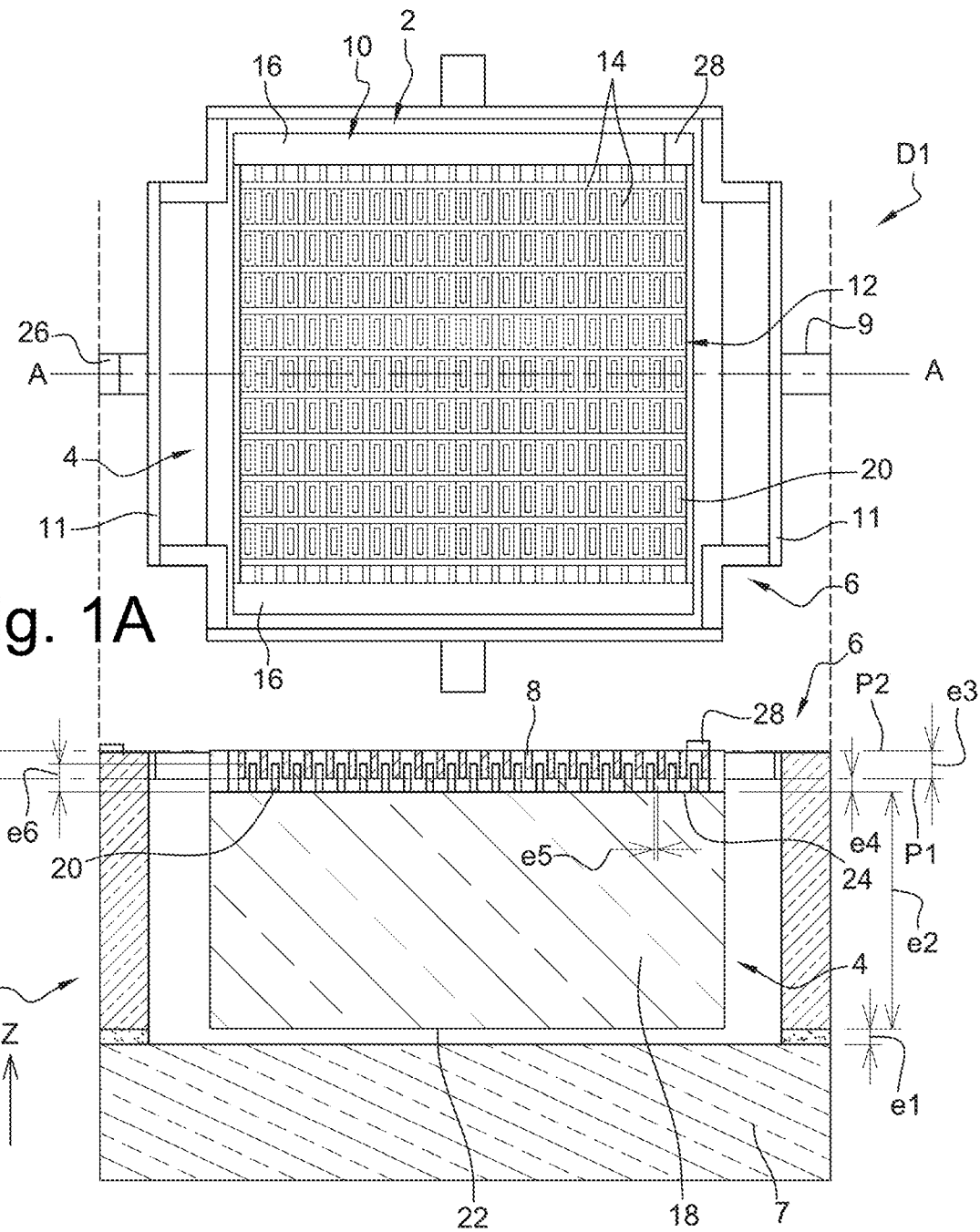
FIG. 1A is a view of an example embodiment of the MEMS and/or NEMS device according to the invention.
FIG. 1B is a sectional view of the device in FIG. 1A along section plane A-A.

FIGS. 1A and 1B show an example embodiment of a device D1 according to the invention. The device D1 comprises a fixed part 2 and a mobile part 4 suspended from the fixed part 2 by suspension means 6, for example springs, so that the mobile part 4 can move in an out-of-plane direction Z orthogonal to the median plane of the device.

The fixed part 2 comprises a support or substrate 7 and fixed electrodes 8. In the example shown, the fixed part 2 comprises a fixed portion 10 suspended from the substrate. The fixed portion is shaped like a grid comprising a frame 12 and bars 14 extending between a first plane P1 orthogonal to the Z axis and a second plane P2 orthogonal to the Z axis. The bars forming the fixed electrodes 8 extend along the Z direction between planes P1 and P2.

The fixed suspended part 10 is suspended by its lateral edges 16.

The mobile part 4 comprises a mobile support and mobile electrodes 20. In the example represented, the mobile support forms a mass 18. Furthermore, in the example represented, the mass 18 is in the form of a rectangular parallelepiped comprising a first face 22 and a second face 24 perpendicular to the Z direction, the first face 22 facing the substrate 7. The second face 24 is located facing the fixed suspended part 10.

On FIG. 2, the mobile electrodes 20 can be seen extending longitudinally along the Z direction and that comprise a first end 20.1 fixed directly to the second face 24 of the mass 18 and a second free end 20.2. The mobile electrodes 20 are arranged between the fixed electrodes 8, their second free end 20.2 being located between planes P1 and P2.

In this application, the expression "an electrode extends along the Z direction" means an electrode the surface(s) of which will face surfaces of other electrodes so as to form one or more variable capacitors by variation of surface area extend(s) approximately parallel to the Z direction. For example, the electrodes can be long and thin and their surface areas can be large, the air gap between the electrodes being relatively small due to the etching ratio between the etching depth and the etching width. As a variant, the cross-section of the electrodes can be large to provide a certain stiffness, while keeping a relatively small air gap. The etching ratio between the etching depth and the etching width is for example of the order of 20.

In the example represented, the mass 18 is located under the fixed electrodes. Due to the connection of the mobile electrodes directly to the second face 20.1 of the mass 18, at least at rest only part of the mobile electrodes is positioned between the fixed electrodes. Thus, at rest, the surface area of each mobile electrode 20 facing a fixed electrode is less than the total surface area of this same mobile electrode and is less than the total area of this same fixed electrode facing it. For example, at rest, of the order of 50% of the surface area of electrodes faces a surface of another electrode. The width of electrodes is typically between a few hundred nm and a few gm and their height is a few μm.

The result is that displacement in the mobile part in either direction along the Z direction can be detected by all fixed and mobile electrodes.

The suspension means 6 extend the mobile part laterally towards the fixed part. In the example represented, they are at the same level as the mobile electrodes and are anchored to the support by anchor pads 9. In the example represented, there are eight suspension means, each formed by a beam 11 extending parallel to an edge of the mobile part and anchored to the pad 9. The beams 11 can deform in bending along an out-of-plane direction.

In the example represented, the mobile electrodes are in the shape of pins with a rectangular section. As will be seen later in the description, this shape is not limitative.

The device also comprises at least one electrical contact 26 to connect mobile electrodes to an external system. In the example represented and advantageously, the external system is made on the fixed part and electrically connected to the mobile electrodes 20 by suspension means made of an electrically conducting material. Connection to the external system is facilitated. As a variant, the electrical contact 26 can be made directly on the mobile part.

The device also comprises a contact pad 28 connected the fixed electrodes 8 to the external system. In the example represented, the contact is formed in one corner of the frame.

We will give some dimensions of the device, solely as an example. These dimensions are dimensions at rest. These dimensions are chosen as a function of the application of the device, the required displacement amplitude of the mobile part relative to the fixed part . . .

The distance e1 between the first face 22 of the mass and the substrate is equal to 2 μm, the thickness of the mass e2 is equal to 60 μm, the thickness e3 of the frame that corresponds to the length of the fixed electrodes is equal to 5 μm, the distance e4 between the second face 24 of the mass and the face facing the fixed suspended portion in plane P1 is equal to 3 μm and the air gap e5 between a fixed electrode and a mobile electrode is equal to 400 nm. The length e6 of the mobile electrodes is also equal to 5 μm.

FIG. 2 shows an enlarged view of the electrodes of the device in FIG. 1A.

We will now describe operation of the device.

In the case of a detection device such as an accelerometer, when an acceleration force is applied to the mass along the Z direction, the mass moves along the Z direction. When the mass moves upwards in the representation in FIG. 2, the ratio between the surface area of the mobile electrodes and the surface area of the fixed electrodes increases and the capacitance increases, and when the mass moves downwards in the representation in FIG. 2, the ratio between the surface area of the mobile electrodes and the surface area of the fixed electrodes reduces and the capacitance decreases. Thus, the direction of displacement of the mobile part can be determined by detecting the direction of variation of capacitance.

All electrodes participate in detecting the direction of displacement of the mobile part.

Furthermore, the entire surface of the mass is fitted with electrodes, therefore the device has a high density of electrodes.

In the case of an actuator, due to the offset along the direction of the fixed and mobile electrodes, application of a potential difference between the electrodes causes an attraction between the electrodes and the mobile part moves towards the fixed suspended part 10, the mobile part 4 is therefore displaced upwards in the representation shown in FIG. 1B.

FIGS. 3A and 3B show another example embodiment of the device D2 according to the invention. This device is different from that shown in FIGS. 1A and 1B in that part of the mobile electrodes is not fixed directly to the second face of the mass.

The device comprises a fixed part 102 comprising a fixed suspended part 110 comprising fixed electrodes 108 and an anchored part 130 anchored directly to the substrate.

The fixed suspended portion 110 is similar to the fixed suspended portion of the device in FIGS. 1A and 1B.

In the example represented, the anchored portion 130 is in the form of a rectangular parallelepiped comprising a free face perpendicular to the Z direction comprising fixed electrodes 108' extending along the Z direction.

In the example represented, the fixed suspended part 110 and the anchored portion 130 are not directly mechanically connected to avoid electrical connections. As a variant, they could be directly mechanically connected but electrically insulated from each other.

The fixed suspended part 110 and the anchored portion 130 are electrically insulated from each other. The device D2 comprises an electrical connection pad 136 to connect the electrodes 108 to the external system and an electrical connection pad 138 to connect the electrodes 108' to the external system.

The mobile part comprises a mass 118, mobile electrodes 120 on its second face extending along the Z direction. The mobile part also comprises a mobile suspended portion 132 extending between the mass 118 and the fixed part 102. The mobile suspended portion 132 comprises a grid shaped structure in which the bars form mobile electrodes 120'. The mobile suspended portion 132 is rigidly connected to the mass 118 so as to form a single mobile part and is suspended from the fixed part by suspension means.

The mobile suspended part 132 is located above the anchored portion 130 such that the fixed electrodes 108' are located between the mobile electrodes 120'.

Therefore, as shown diagrammatically on FIG. 3A, the mobile part extends partly below the fixed part and partly above the fixed part.

Therefore, the device comprises a first capacitive assembly comprising the mass 118 and the fixed suspended portion 110 and a second capacitive assembly comprising the mobile suspended portion 132 and the anchored portion 130.

The suspension means of the mobile part are similar to the suspension means of the device D1.

An electrical connection pad 140 of the mobile part is provided on the fixed part and is electrically connected to the mobile part by the suspension means.

The operation of the device D2 in detection is as follows: When an acceleration is applied to the mass, the mass moves along the Z direction, causing the electrodes 120 to displace relative to the electrodes 108 and the electrodes 120' to displace relative to the electrodes 108'. For example, when the mass moves upwards, the electrodes 120 penetrate further between the electrodes 108 and the electrodes 120' move away from the electrodes 108'. The capacitances of the first and second capacitive assemblies vary in opposite directions.

This structure enables differential detection due to the distribution into two groups of mobile and fixed electrodes and the separate polarisation of the fixed electrodes. Furthermore, electrostatic forces generated by the polarisation of electrodes between electrodes 108 and 120 between electrodes 108k and 120' are in equilibrium. Therefore, the offset due to this polarisation is eliminated.

In the case of an actuator, the electrodes are polarised. The electrodes 120 penetrate between the electrodes 108, the mass moves upwards along the direction of the arrow F1 and the electrodes 120' penetrate downwards between the electrodes 108' along the direction of the arrow F2. The arrows F1 and F2 are in opposite directions and consequently the mobile part pivots about an X axis. Therefore, the device D2 can be used to make an actuator generating a rotation torque about the X axis. It would be possible to envisage applying the potential difference to only one of the two electrodes to make a translation.

The dimensions of the device D2 can be identical to the dimensions of device D1.

Figures 4A, 4B:
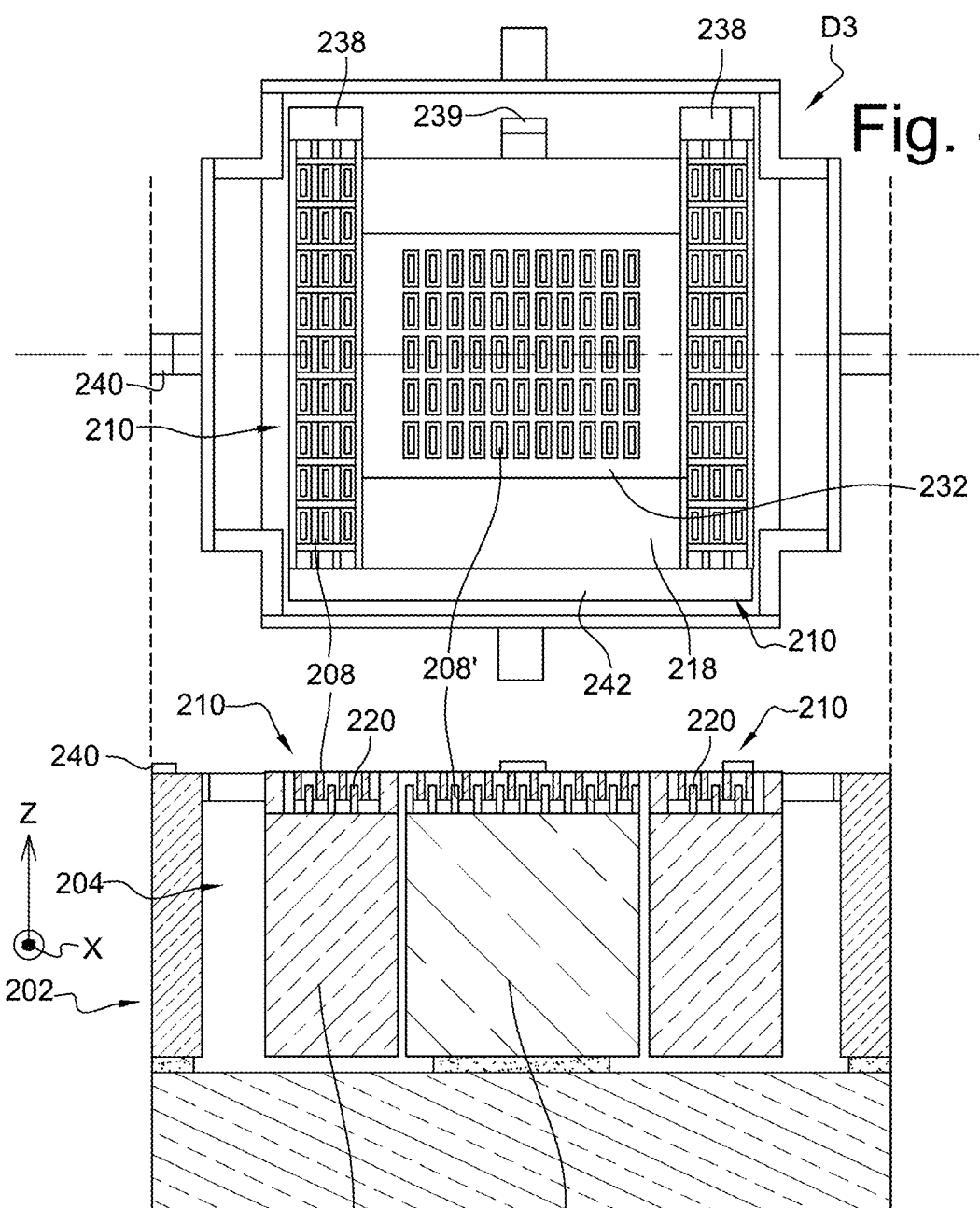
FIG. 4A is a view of an example embodiment of the MEMS and/or NEMS device according to the invention.
FIG. 4B is a sectional view of the device in FIG. 4A along section plane C-C.

FIGS. 4A and 4B show a variant D3 of the device D2

Figure 4C:
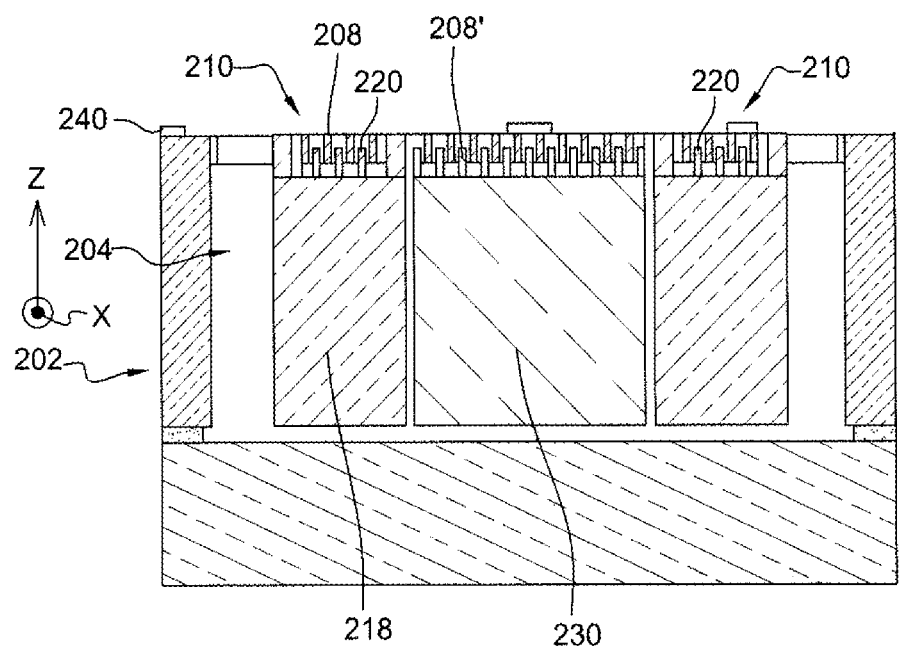
FIG. 4C is a sectional view of the device in FIG. 4A with two mobile parts.

D3 comprises a fixed part 202 comprising an anchored portion 230 and two fixed suspended portions 210, one on each side of the anchored portion 230. FIG. 4C shows an embodiment with anchored portion 230 also being mobile.

The anchored portion 230 comprises fixed electrodes on the free face extending along the Z direction. The two fixed suspended portions 210 are similar to the fixed suspended portion 110. They are mechanically connected at a longitudinal end by a beam 242 that also anchors them to the substrate. The fixed suspended portions 210 are also anchored to the substrate at their other longitudinal end. The anchored portion 230 is electrically insulated from the fixed suspended portions 210. As for the device D2, the fixed suspended parts 210 are not directly mechanically connected to the anchored portion 230 to avoid electrical connections. As a variant, they could be directly mechanically connected and electrically insulated from each other.

A electrical connection pad 238 is used to make the electrical connection of the electrodes 208, and an electrical connection pad 239 makes a separate electrical connection of the electrodes 208'.

The mobile part 204 comprises a mobile suspended portion 232 and a mass 218 surrounding the mobile suspended portion 232 and forming a rigid assembly with this mobile suspended portion. The mobile suspended portion 232 is similar to the mobile suspended portion 132. The top view of the mass 218 is square shaped. Mobile electrodes 220 are fixed on the second face of the mass 218 and extend along the Z direction.

The suspension means of the mobile part are similar to the mobile suspension means of the device D1.

An electrical connection pad 240 makes the electrical connection of the mobile part 204 to the external system.

As can be seen on FIG. 4B, the central zone of the mobile part 204 is located above the fixed part 202 and its lateral zones are located below the fixed part.

The dimensions of the device D3 can be identical to the dimensions of devices D1 and D2.

Therefore, the device D3 comprises a first capacitive assembly comprising the mass 218 and the fixed suspended portions 210 and a second capacitive assembly comprising the mobile suspended assembly 232 and the anchored part 230.

Operation of device D3 is similar to operation of device D2.

As in the case of device D2, device 03 enables differential detection. It can also balance electrostatic forces due to the polarisation of detection electrodes. Unlike device D2, the mobile part of device D3 cannot rotate about the X axis due to the symmetric distribution of upwards and downwards electrostatic forces on each side of the plane containing the X and Z axes. False detections due to tipping of the mass are avoided.

The anchored portion and the fixed suspended portions are differently polarised so that the device D3 can be used as an actuator.

As a variant, the mass could comprise electrodes over its entire upper surface and the fixed suspended portions could cover the entire mass.

As a variant, the device D3 could comprise a fixed part comprising a fixed suspended portion and two anchored portions on each side of the fixed suspended portions and a mobile part comprising a central mass surrounded by a mobile suspended portion in the form of a frame.

Figure 5:
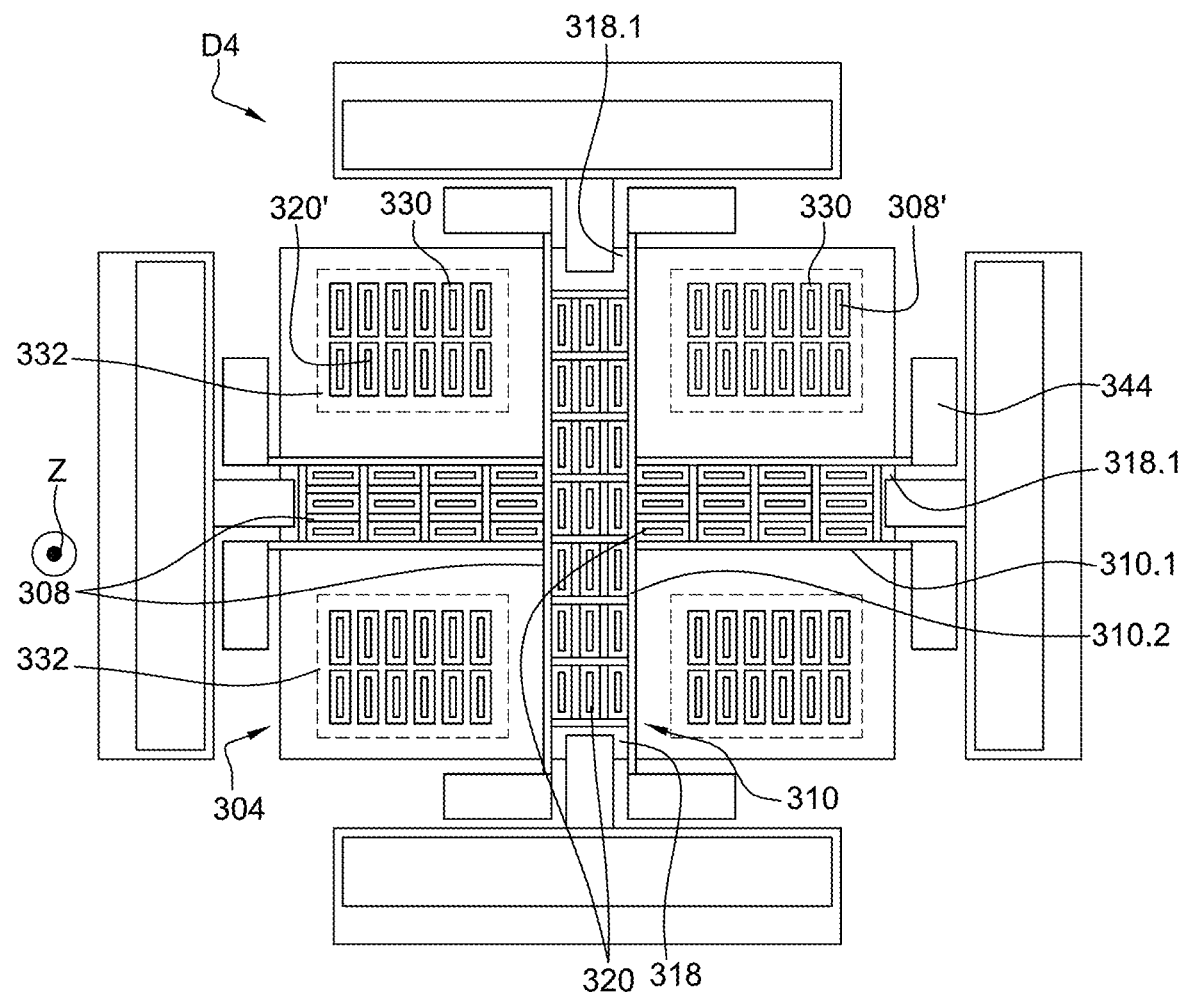
FIG. 5 is a top view of another example embodiment of a MEMS and/or NEMS device according to the invention.

FIG. 5 shows another example embodiment of a device D4 according to the invention. The shape of the device 04 as seen in a top view is rectangular.

D4 comprises a fixed portion comprising a fixed suspended portion 310 comprising two orthogonal branches 310.1, 310.2 forming a cross. The two branches 310.1, 310.2 form grids in which the bars form fixed electrodes 308 extending along the Z direction and are anchored on the support at their longitudinal ends by anchor pads 344. The fixed part comprises four anchored portions 330 comprising fixed electrodes 308' on the second face extending along the Z direction. As seen from a top view, the four zones defined by the mobile suspended portion are occupied by an anchored part 330.

Each of the four anchored portions 330 can be polarised by an electrical contact (not shown). As a variant, the four anchored portions 330 are electrically connected together and polarised by a single electrical contact. This is possible due to a fabrication method making use of two layers as will be described below. Furthermore, the fixed suspended portion 310 is insulated from the anchored portions 330 and is polarised independently of the anchored portions 330.

The shape of the mobile part 304 as seen in a top view is rectangular. It forms a mass comprising four rectangular holes each of which holds an anchored portion 330. Each hole is closed by a mobile suspended portion 332 located above an anchored portion 330. Each mobile suspended portion 332 is in the form of a grid, the bars of which form mobile electrodes 320'. Mobile electrodes 320 are formed on the mass and are arranged cross-wise so as to cooperate with the fixed suspended part. The arms of the cross form orthogonal bisectors of the rectangle formed by the mobile part. The mass comprises mobile electrodes 320.

Therefore, the device comprises a first capacitive assembly comprising the mobile part 304 and the fixed suspended part 310 and a second capacitive assembly comprising the mobile suspended portions 332 and the anchored portions 330.

Advantageously, the mobile part is suspended from the support by four suspension means connected to the mobile part at the ends 318.1 of the branches of the cross that form the most rigid zones of the mobile part, preventing bending of the mobile part. The suspension means are similar to the devices described above. As a variant, the mobile part could be suspended by the mobile suspended portions 332.

This device D4 has the advantage of reducing the proportion of the thin suspended surface in a single piece and therefore reducing risks of damage. Compared with device D3, the mobile suspended portion is separated into four zones with smaller surface area stretched between two arms of the mass 318. Furthermore, like device D3, the structure of the device D4 is balanced, there is no offset of the mobile part due to the polarisation of the electrodes in detection and no torque is applied to it to make it pivot. False detections due to tipping of the mass are thus avoided.

As for device D3, it would be possible to envisage inverting the mobile part and the fixed part.

Figure 6:
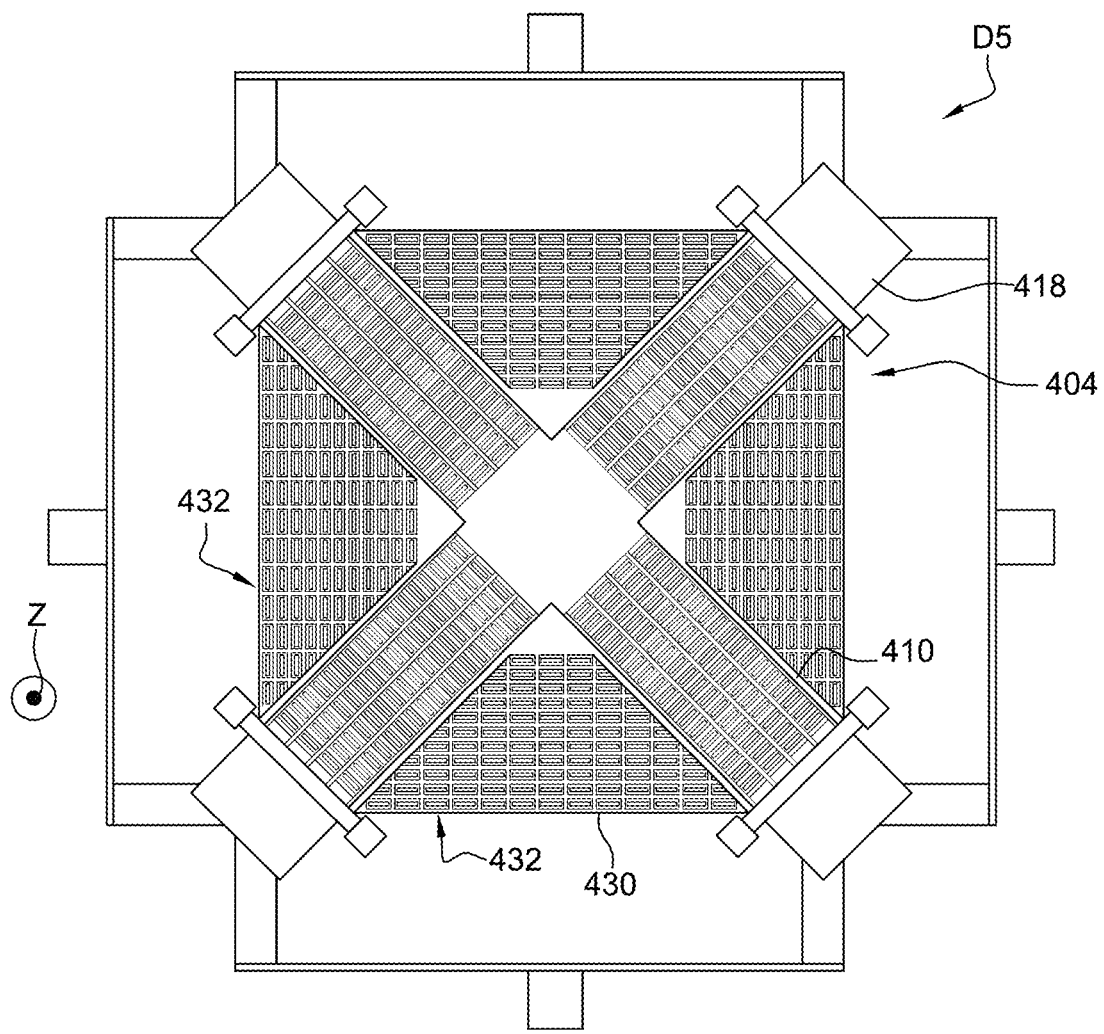
FIGS. 6 and 7 are variant embodiments of the device in FIG. 5, FIGS. 8A to 8C are top views of an example embodiment of the electrodes.

FIG. 6 shows a device D5 that is a variant of device D4. Device D5 is different from device D4 in that the cross-shaped mass 418 forms the diagonals of the rectangle formed by the mobile part 404. The mobile suspended parts 432 are then triangular in shape and are suspended from the mass by two of their sides, advantageously by their three sides if they are surrounded by the mobile mass.

Advantageously, the mobile part is suspended by the ends of the mass 418.

The fixed suspended part 410 is also in the form of a cross located above the mass 418.

The anchored portions 430 are shaped like triangles and are located under the mobile suspended portions.

The anchored portions 430 are electrically insulated from the fixed suspended part 410 and are polarised separately.

Figure 7:
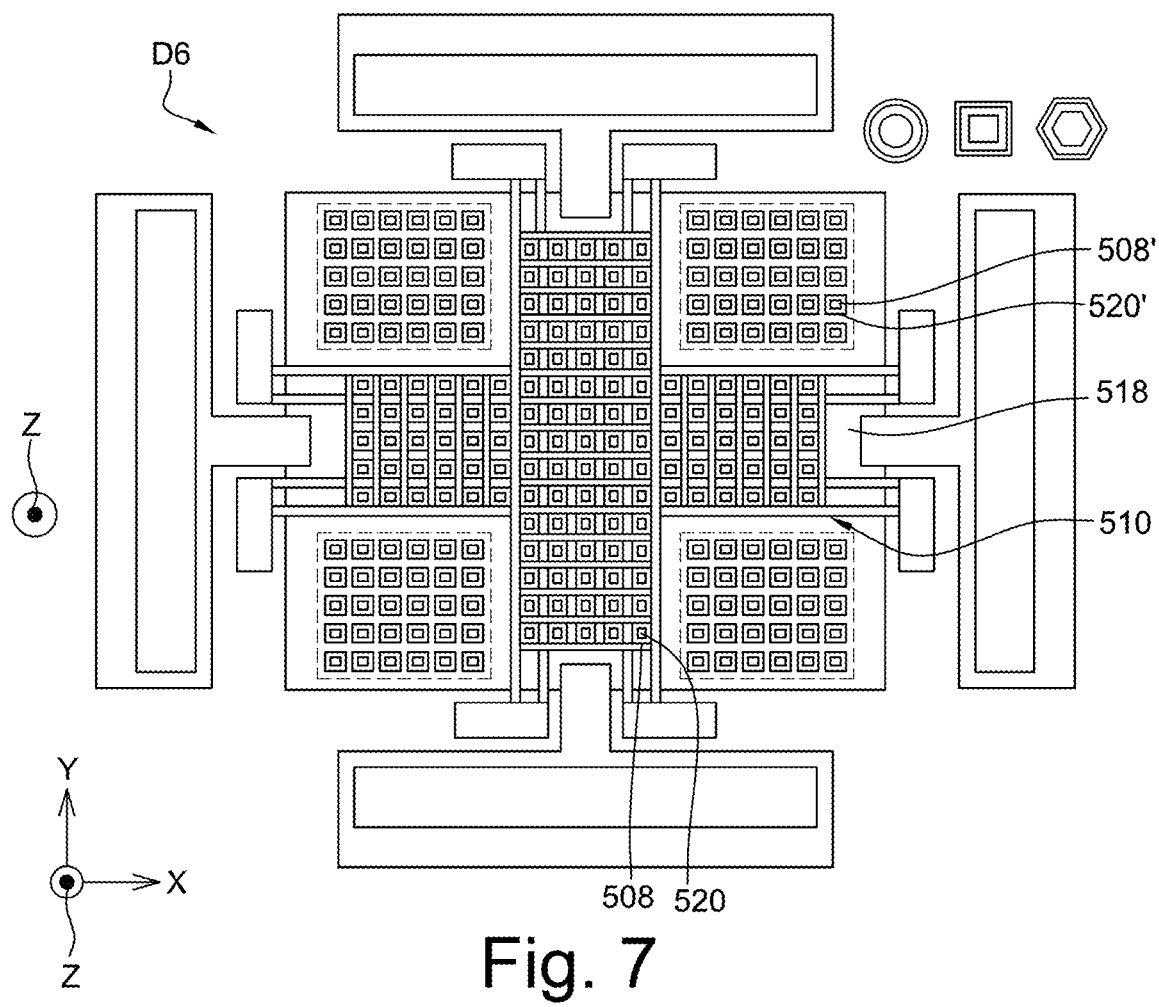

FIG. 7 shows a variant D6 of the device D4.

The device D6 is different from the device D4 by the shape of the electrodes.

The mass 518 of the device D6 comprises mobile electrodes 520, the section of which in a plane parallel to the median plane of the device is square. The fixed suspended part 510 comprises fixed electrodes 508 delimiting passages with a square cross-section from each other. The cross-section of the fixed electrodes 508' of the anchored part 530 is square and they fit between the electrodes 520' of the mobile suspended portion 532. The entire lateral surface of the electrodes participates in varying the capacitance.

This shape of electrode reduces the capacitive density, but it has the advantage that it reduces risks of sticking due to the pull-in phenomenon because electrostatic forces are equally distributed between the two in-plane orthogonal directions X and Y, instead of being concentrated along a single direction, for example in the case of rectangular electrodes. Moreover, the structure is better balanced, the same forces and the same associated behaviour changes are applied to it in the two directions, X and Y.

Figure 8A:
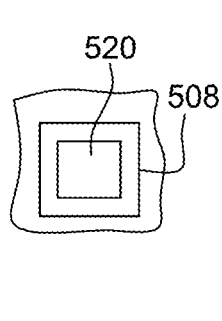
Figure 8B:
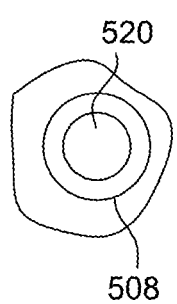
Figure 8C:
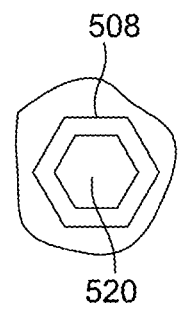

FIG. 8A shows an enlarged view of a mobile electrode 520 fitting into a fixed electrode 508. Other shapes could be envisaged, for example electrodes with a circular cross-section or with a polygonal cross-section such as a hexagon shape, as shown on FIGS. 8A, 8B and 8C.

Other elements of the device are similar to those in 04.

In all example embodiments, it could be envisaged to have a mobile part with several polarisations, the electrodes of the mass being isolated from the electrodes of the mobile suspended part. To achieve this, the mobile mass and the mobile frame could be connected by a partially released oxide layer. Advantageously, the fixed parts can potentially be connected electrically.

All devices D1 to D6 can be used as detection devices or as actuators, however they are better adapted to making detection devices due to the presence of an inertial mass that contributes to the detection of inertial force. In general actuators do not require the use of a mass for their operation.

Figures 9A, 9B:
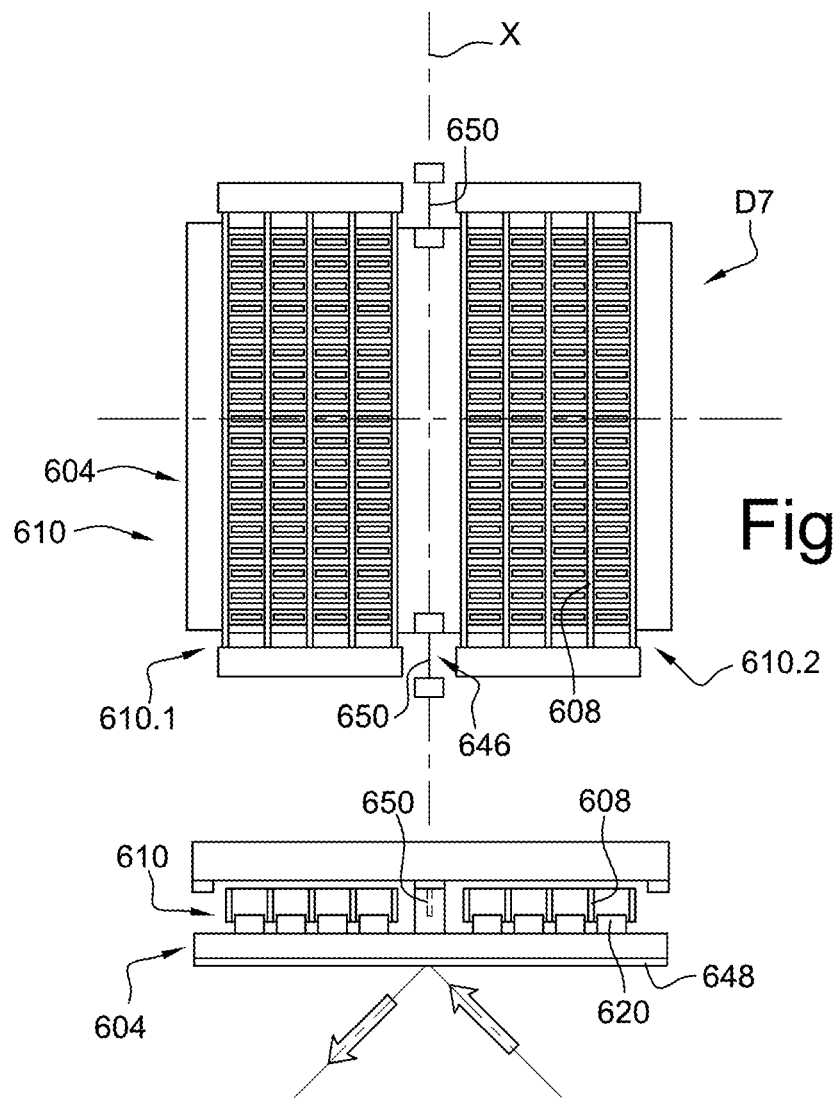
FIG. 9A is a top view of an example embodiment of the MEMS and/or NEMS device according to the invention, particularly suitable for fabrication of an actuator, in which the substrate has been omitted.
FIG. 9B is a sectional view of the device in FIG. 9A along section plane D-D.

FIGS. 9A and 9B show an example of a device D7 according to the invention, particularly suitable for use as an actuator. In this example, the actuator is used to displace a micro-mirror. But the device according to the invention can be also be used for example to make a gyrometer with out-of-plane actuation, MEMS resonators, etc.

The device D7 comprises a substrate, a fixed suspended part 610, a mobile part 604 with a pivot articulation 646. In the example shown, the pivot articulation 646 comprises two beams 650 aligned along the X pivot articulation axis and capable of deforming in torsion about the pivot axis.

The fixed suspended part 610 comprises two subassemblies 610.1, 610.2 of fixed electrodes 608, arranged on each side of the X pivot axis electrically insulated from each other so that they can be separately and differently polarised.

The mobile suspended part comprises mobile electrodes 620 on one face and a reflecting surface 648 forming the mirror on the other face. The mirror pivots about the X axis in one direction or the other, depending on the state of polarisation of the fixed electrodes.

As can be seen on FIGS. 9A and 9B, the actuator does not use a thick mobile part forming a seismic mass, but an actuator with a seismic mass lies within the scope of this invention.

Figure 13:
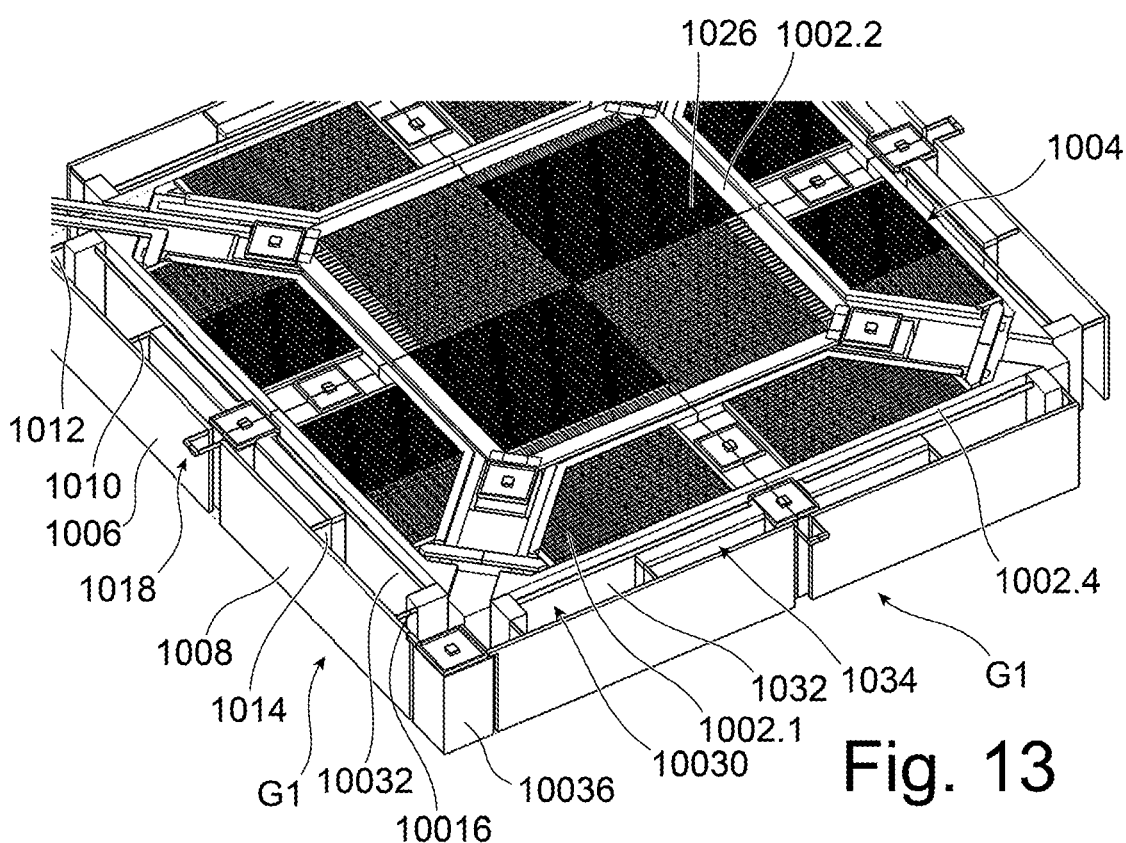
FIG. 13 is a perspective view of an inertial sensor according to the invention making use of guiding means.
Figure 14A:
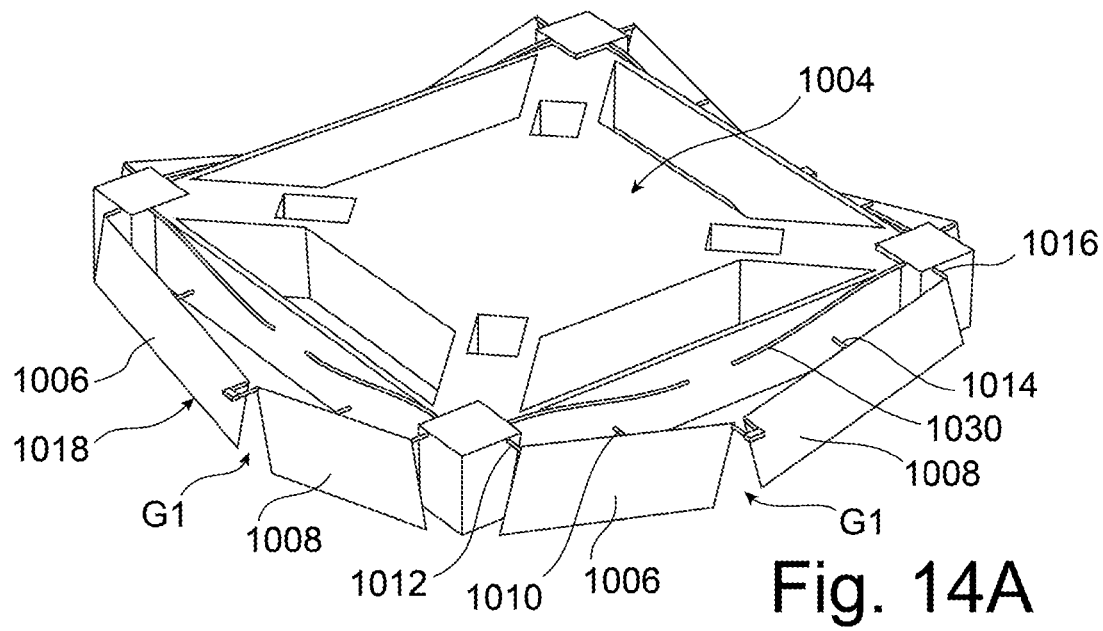
FIGS. 14A and 14B are views of the sensor in FIG. 13 in two different states.
Figure 14B:
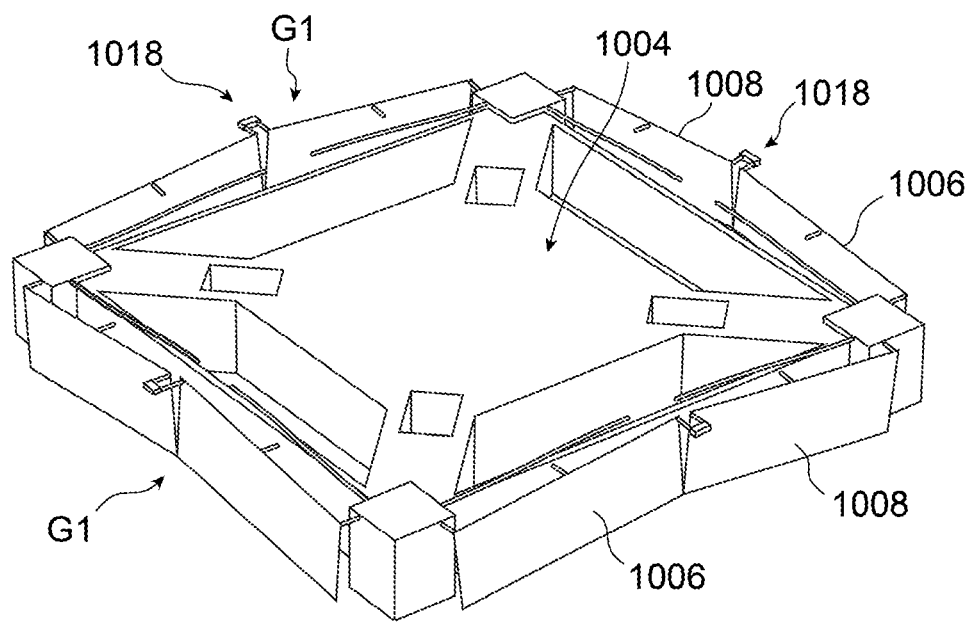

FIGS. 13 and 14A and 14B partially show an example embodiment of a particularly advantageous embodiment of a device according to the invention, comprising out-of-plane displacement guiding means for the mobile part. This device can be used as an out-of-plane accelerometer.

This device is capable of making a differential measurement of the displacement of the mass.

The device comprises two detection assemblies so as to enable a differential measurement.

The device comprises a mass 1004 comprising an external frame 1024 located above a first part 1002.1 of the support and a central part 1026 located below a second part 1002.2 of the support.

The frame and the first part 1002.1 comprise interdigitated electrodes forming first capacitors and the central part 1026 and the second part 1002.2 comprise interdigitated electrodes forming second capacitors. Out-of-plane displacement of the mass causes an opposite variation of the capacitances of the first and second capacitors, which enables the differential measurement.

The device also comprises means 1030 of suspension of the mass from the support 1002.

In this example, there are eight suspension means 1030, with two on each side of the mass. Each is composed of a beam 1032 extending parallel to one edge of said mobile element and anchored at one end to an anchor pad 1034 of the support and at another end to the mass. The beams 1032 can deform in bending along an out-of-plane direction. The beams 1032 can also deform by in-plane bending, but the fact of using 1008 beams 1032, is equivalent to oppose the high stiffness of an orthogonal beam in compression/stretching to in-plane displacement. Therefore, these suspension means provide a certain degree of in-plane stiffness.

The device also comprises guiding means G1. Each of the guiding means extends along one side of the frame 1026. The guiding means are diagrammatically represented on FIGS. 15A to 15D.

FIGS. 15A to 15D show a diagrammatic representation of guiding means G1 according to a first embodiment.

The device D9 extends mainly in the XY plane. The device D9 comprises a support 1002, an element that will move along the Z direction orthogonal to the XY plane. The element 1004 is suspended from the support such that it can move relative to the support. In this diagrammatic representation, the support 1002 is shown diagrammatically by two anchor pads.

The mobile element 1004 is considered to be rigid.

A element is said to be rigid for the purposes of this application when its deformations relative to the global displacement in the out-of-plane direction are negligible.

The device D9 also comprises guiding means G1 for guiding in translation the element 1004 along the Z direction.

The means G1 comprise two rigid arms 1006, 1008. In this example, the two arms are aligned along the X direction. Each arm 1006, 1008 comprises two longitudinal ends 1006.1, 1006.2 and 1008.1, 1008.2 respectively. The ends 1006.2 and 1008.1 are located close by and are called "proximal ends" 1006.1 and 1008.2 are called "distal ends". In this example, the faces of the proximal ends 1006.2 and 1008.1 are facing each other.

The arm 1006 is mechanically connected to the support by a first pivot link 1010 with axis Y1 and it is mechanically connected to the element by a second pivot link 1012 with axis Y2.

The arm 1008 is mechanically connected to the support by a third pivot link 1010 with axis Y3 and it is mechanically connected to the element by a fourth pivot link 1016 with axis Y4.

in the example shown, the first pivot link 1010 is located at the centre of the arm 1006 and the second pivot articulation 1012 is located at the distal end 1006.1. The third pivot articulation 1014 is located at the centre of the arm 1008 and the fourth pivot link 1016 is located at the distal end 1008.2.

Furthermore, the means G1 comprise an articulation 1018 between the two arms 1006, 1008 connecting the proximal ends 1006.2 and 1008.1.

The articulation 1018 comprises a rigid part 1020 and two pivot links 1022, 1024 with axis Y5, Y6, each pivot link 1022, 1024 connecting the rigid part 1020 to a proximal end 1006.2, 1008.1 respectively.

The axes of the pivot articulations 1010, 1012, 1014, 1016, 1022, 1024 are parallel to each other.

At least two pivot articulations connected to each arm have a degree of freedom in translation in the plane of the device along the arms. The pivot articulations advantageously comprise a beam capable of deforming in torsion around the pivot axis. Beams also have some capacity for bending.

In the example shown, all pivot links 1010, 1012, 1014, 1016, 1020, 1022 are made by beams capable of deforming in torsion about the pivot axis.

This degree of freedom in translation can be conferred on all pivot articulations. In the example shown and advantageously, the pivot links are made by beams capable of deforming in torsion about the pivot axis.

The arms 1006 and 1008 move in a plane P1 parallel to the XZ plane.

We will now describe operation of the invention in the case of an accelerometer, the element 1004 forming for example an inertial mass.

When the sensor is subject to an out-of-plane acceleration, i.e. along the Z direction, the inertial mass 1002 is displaced in translation along the Z direction. The guiding means G1 guide the inertial mass. The arms 1006, 1008 pivot about the links 1012, 1016 in opposite directions, as shown diagrammatically on FIG. 15A. The pivot links 1010 and 1014 are also loaded in opposite directions, as are links 1022, 1024. The articulation 1018 imposes the same out-of-plane displacement at the distal ends 1006.1, 1008.2, and therefore forces the arms to pivot in opposite directions.

Figure 15A:
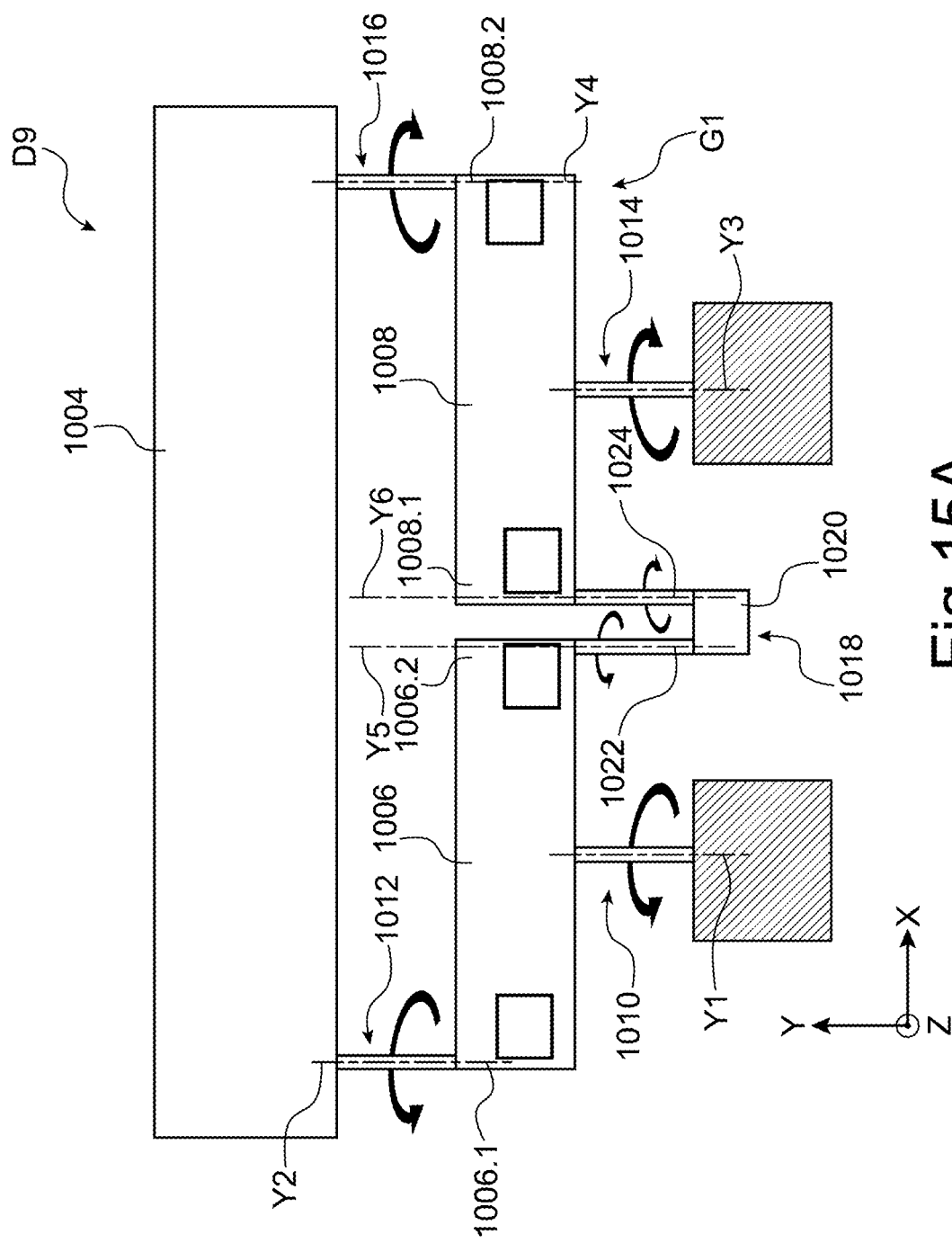
FIG. 15A is a view of a device using translation guiding means according to a first example embodiment, the mobile element being stressed in the out-of-plane direction.
Figure 15B:
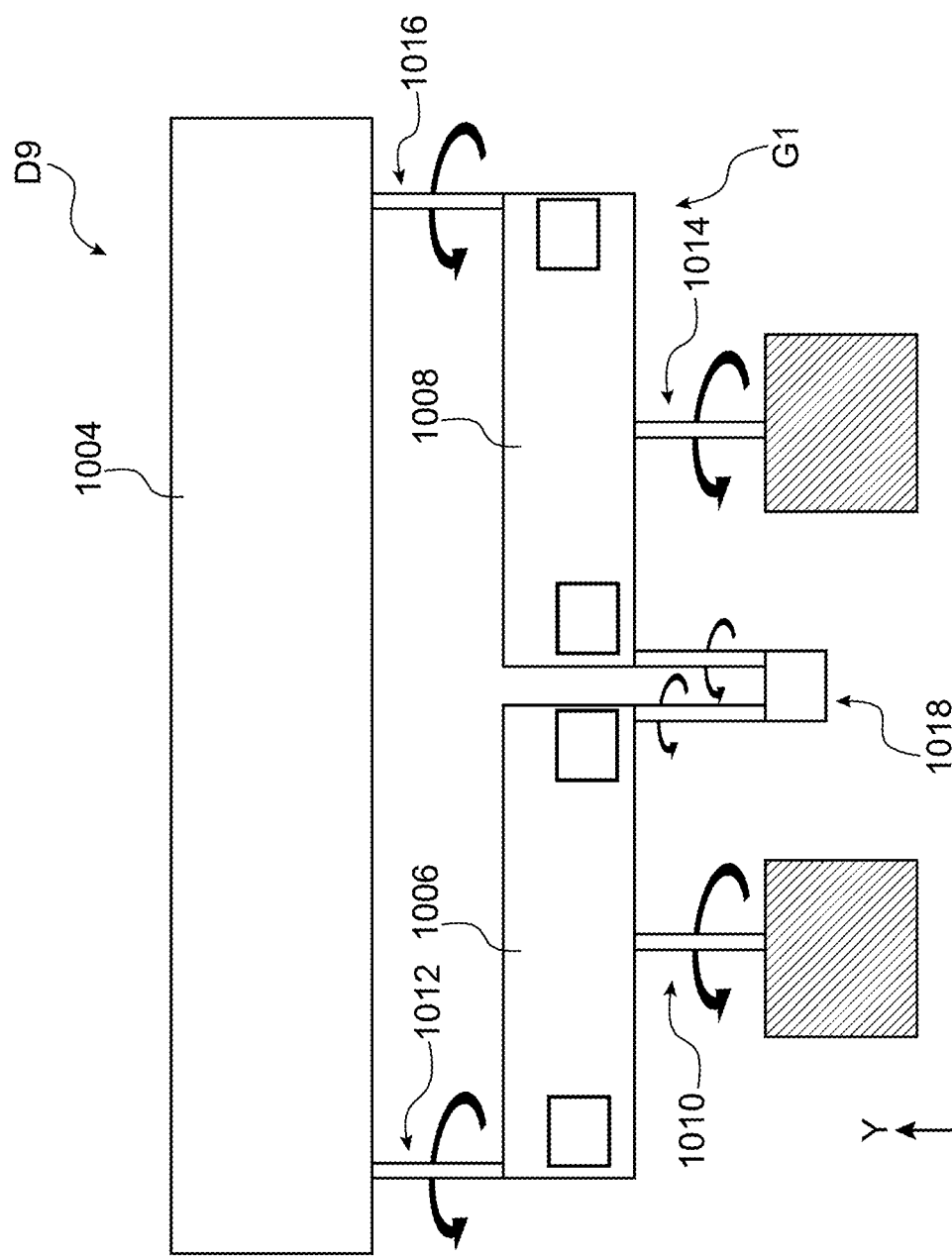
FIG. 15B shows the device in FIG. 15A, the mobile element being stressed in tipping.

Furthermore, since the arms and their pivot links are symmetric with each other, the distal ends move over the same distance, forcing a displacement of the mass parallel to the support (FIG. 15B)

Figure 15C:
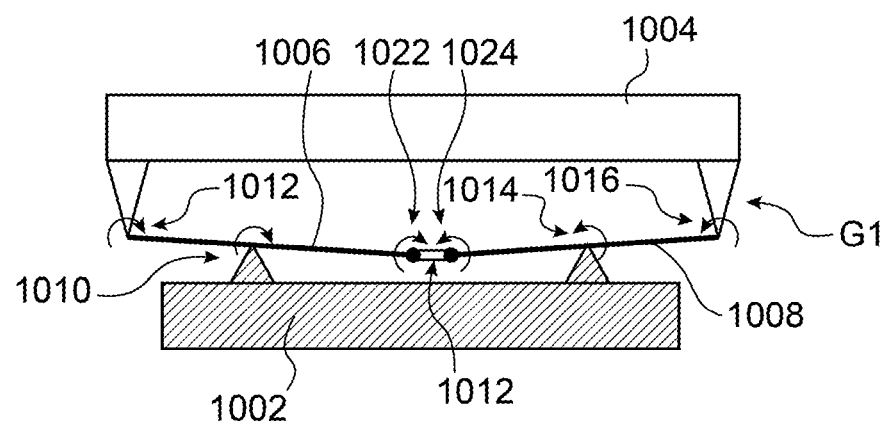
FIG. 15C is a diagrammatic view of the orientation of the different elements of the guiding means in the situation in FIG. 15A.
Figure 15D:
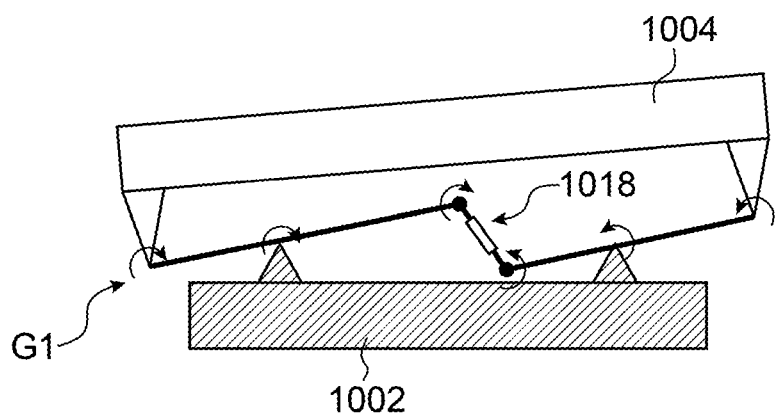
FIG. 15D is a diagrammatic view of the orientation of the different elements of the guiding means in the situation in FIG. 15B.

In the case of an in-plane acceleration, the directions of rotation at all pivot links are the same, as shown on FIG. 15C, which tends to separate the proximal ends 1006.2 and 1008.1 and to make the inertial mass tilt around an axis parallel to Y.

Use of the articulation 1018 between the arms and more generally the guiding means G1 increases the stiffness and reduces or even prevents such tipping of the inertial mass, which limits risks of a non-linearity in the measurement of the displacement of the mass and risks of damage by contact. The effect of the articulation 1018 is shown diagrammatically on FIG. 15D. In this representation, tipping of the mass is exaggerated for illustration purposes, but it will be understood that the invention prevents tipping of this amplitude.

Preferably, the MEMS and/or NEMS device comprises several guiding means G1 as is the case of the device in FIG. 13, and at least two guiding means with arms that displace in the orthogonal planes P1 and P2 further reducing in-plane displacements. Advantageously, it comprises three guiding means, the arms of two of the guiding means displacing in parallel planes and the arms of the other guiding means displacing in an orthogonal plane. Thus, the in-plane stiffness provided by the guiding means is significantly improved.

The arms 1006 and 1008 can have different dimensions and/or the pivot links may be arranged non-symmetrically. But the choices of the dimensions and the location of pivot links are made such that the mobile element has an out-of-plane displacement.

In some example embodiments, the device may comprise specific suspension means of the element, since the guiding means according to the invention do not necessarily provide suspension and/or sufficiently rigid in-plane retention. The torsion beams also have some capacity for bending and do not necessarily provide sufficient in-plane support for the mobile element.

On FIG. 13, the distal ends 1006.1, 1008.2 of the arms 1006, 1008 of each of the guiding means are mechanically connected by a pivot link to the longitudinal ends of the edges of the frame of the mass. In the example shown, the support comprises four anchor pads 1036 facing the four vertices of the mass and that will cooperate with the arms 1006, 1008 to form stops as will be described in more detail later.

In this practical example, the arms 1006, 1008 are formed by blades that are wide in the Z direction and therefore provide high stiffness in this direction.

Furthermore, in the example shown, the pivot links and the articulation 1018 are located in an upper part of the arms 1006, 1008. It will be understood that the pivot links and the articulation 1018 can be located in intermediate zones and/or in a lower part of the arm and/or in the upper part.

Therefore, the guiding means guide the mass at its four vertices.

The suspension means 1030 limit or even prevent in-plane movements.

The combination of suspension means and guiding means can result in a device with improved control over the behaviour of the mass.

FIGS. 14A and 14B show the device in FIG. 13 in two different states. On FIG. 14A, the mass is in the low position, and on FIG. 14B, the mass is in the high position.

In the example in FIG. 13, the mobile element is square in shape and comprises four guiding means.

It would be possible for example for the mobile element to be triangular and to comprise three guiding means. In this case, the planes of the various guiding means should intersect, without being orthogonal.

Figure 16:
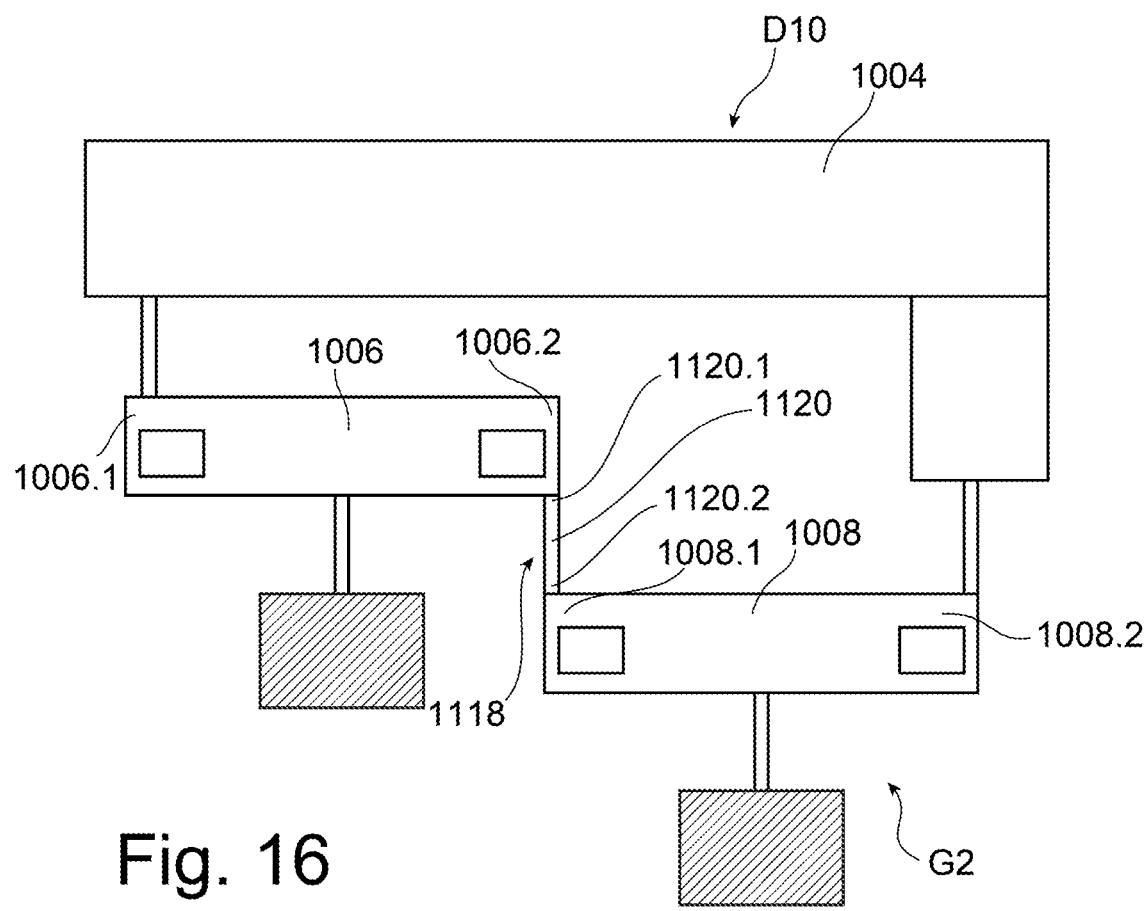
FIG. 16 is a view of a device using translation guiding means according to a second example embodiment.
Figure 17:
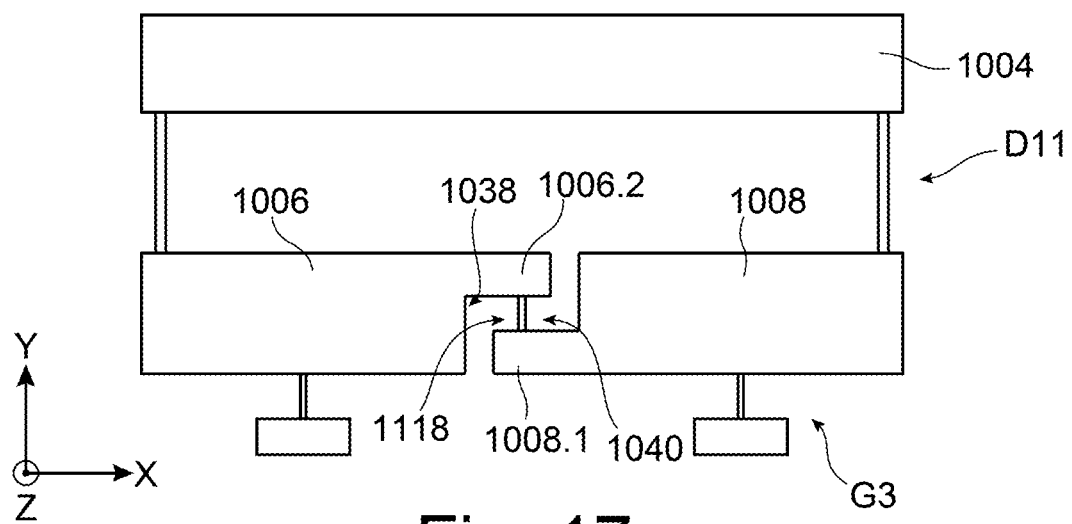
FIG. 17 is a view of a device using translation guiding means according to a variant of the second example embodiment.

FIGS. 16 and 17 show a second example embodiment of a device according to the invention.

The primary difference between the device D10 and the device D9 is that the guiding means G2 are different from the guiding means G1 due to the articulation 1118 between the arms 1006, 1008.

On FIG. 16, the arms 1006 and 1008 are located in two parallel planes. Thus, the faces of the proximal ends 1006.2, 1008.1 are no longer facing each other but are approximately in the same plane R perpendicular to the plane of the arms 1006, 1008.

The articulation 1118 comprises a torsion beam 1120 extending in the plane R, one longitudinal end 1120.1 of which is mechanically connected to a side of the beam 1006 and another end 1120.2 of which is mechanically connected to a side of the facing beam 1008. The use of a torsion beam significantly increases the stiffness.

FIG. 17 shows an advantageous variant device D11 of the device D10. In device D11, the beams 1006, 1008 of the guiding means G3 are such that their dimensions are less than the dimensions of the structure of D10. To achieve this the proximal ends 1006.2, 1008.1 of the beams comprise a cutout 1038, 1040 so that the beams can be brought closer to each other.

Figure 18A:
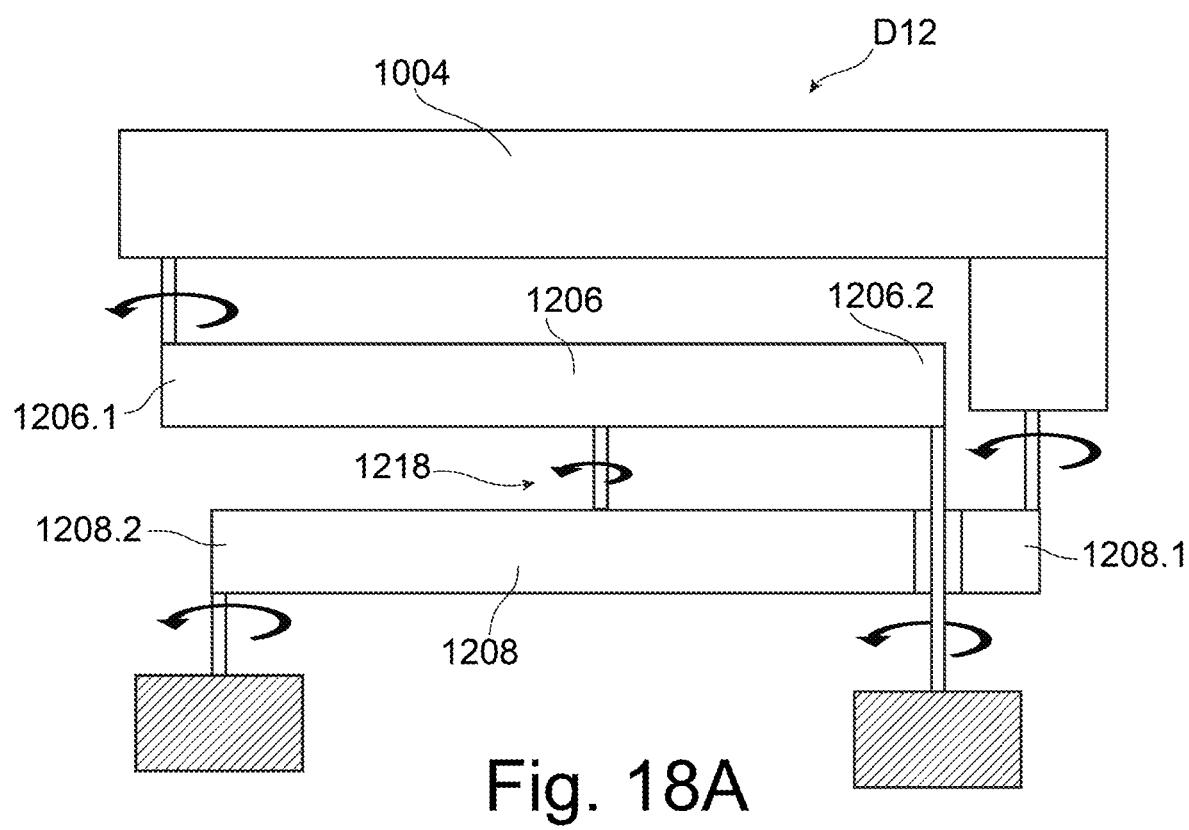
FIG. 18A is a view of a device using translation guiding means according to a third example embodiment.

FIG. 18A shows another example embodiment of a device D12 according to the invention.

In device D12, the arrangements of the pivot links are different from arrangements of the pivot links in devices D9 to D11.

In device D12, the guiding means G4 comprise two arms 1206, 1208 arranged in two parallel planes with an articulation 1218 between the arms 1206, 1208.

A side face of the arm 206 is facing a side face of the arm 1208 and the articulation 1218 extends between the two side faces.

Advantageously, the articulation is formed from a beam that can deform in torsion.

The pivot link between the beam 1206 and the mobile element is located at one longitudinal end 1206.1 of the beam 1206, and the pivot link between the beam 1206 and the support is located at the other longitudinal end 1206.2 of the beam 1206.

The pivot link between the beam 1208 and the mobile element is located at one longitudinal end 1208.1 of the beam 1208, and the pivot link between the beam 1208 and the support is located at the other longitudinal end 1208.2 of the beam 1208.

The pivot links are advantageously made using means that can be deformed in torsion.

In the example represented, the pivot link between the end 1206.2 of the beam 1206 and the support crosses the beam 1208, it is located in a plane located between the support and the beam 1208 so as not to hinder displacement of the beam 1208.

In this example embodiment, the arms are longer than the arms in devices D9 to D11. The result is that the angular displacement of the arms is lower for the same out-of-plane displacement of the mobile element. Firstly, at least one stiffer articulation 1218 can be used, making the device stiffer. Secondly, the stiffness of the torsion bar facing a desired movement is reduced so that lower resonant frequencies and therefore larger displacements can be obtained, with a correspondingly higher signal for the same acceleration.

Figure 18B:
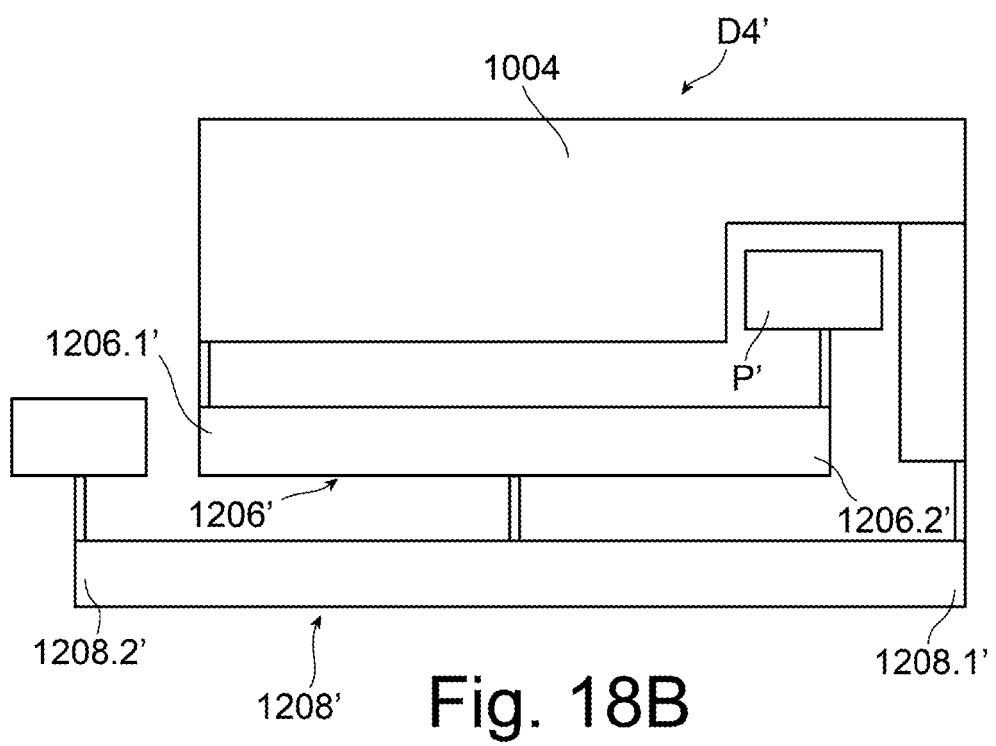
FIG. 18B is a view of a variant embodiment of the device in FIG. 18A.

FIG. 18B shows a device D12' according to a variant embodiment of device D12.

The guiding means comprise two arms 1206', 1208' located in two parallel planes articulated to each other through an articulation 1218'.

A side face of the arm 1206' is facing a side face of the arm 1208' and the articulation 1218' extends between the two lateral faces.

The arm 1208' that is furthest out from the mobile element 1004 is longer than the arm 1206'.

Advantageously, the articulation is formed from a beam that can deform in torsion.

The pivot link between the beam 1206' and the mobile element is located at a longitudinal end 1206.1' of the beam 1206', and the pivot link between the beam 1206' and the support is located at the other longitudinal end 1206.2' of the beam 1206'.

The pivot link between the beam 1208' and the mobile element 1004 is located at a longitudinal end 1208.1' of the beam 1208', and the pivot link between the beam 1208' and the support is located at the other longitudinal end 1208.2' of the beam 1208'.

The arm 1208' that is furthest out from the mobile element 1004 is longer than the arm 1206', such that the pivot articulations between the arm 1208' and the support and between the arm 1208' and the mobile element are outside the arm 1206' and its pivot articulations. Thus, unlike the device D12, there is no superposition between one or more pivot articulations and the arms.

The pivot links are advantageously made using means that can be deformed in torsion.

In the example shown, the mobile element is structured to form a housing for an anchor pad P', which can reduce the size. It would be possible that the mobile element is not structured and that the anchor pad is in front of the mobile element in the example shown.

Figure 19A:
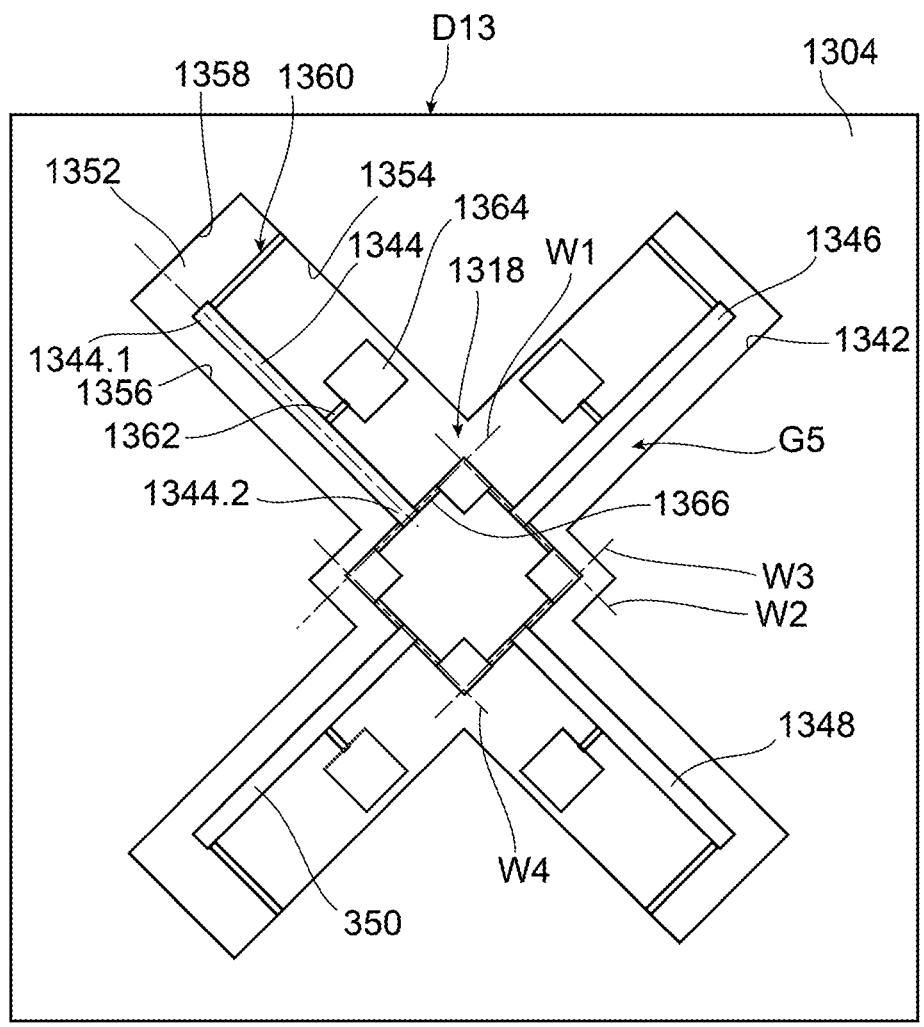
FIG. 19A is a view of a device using translation guiding means according to a fourth example embodiment.
Figure 19B:
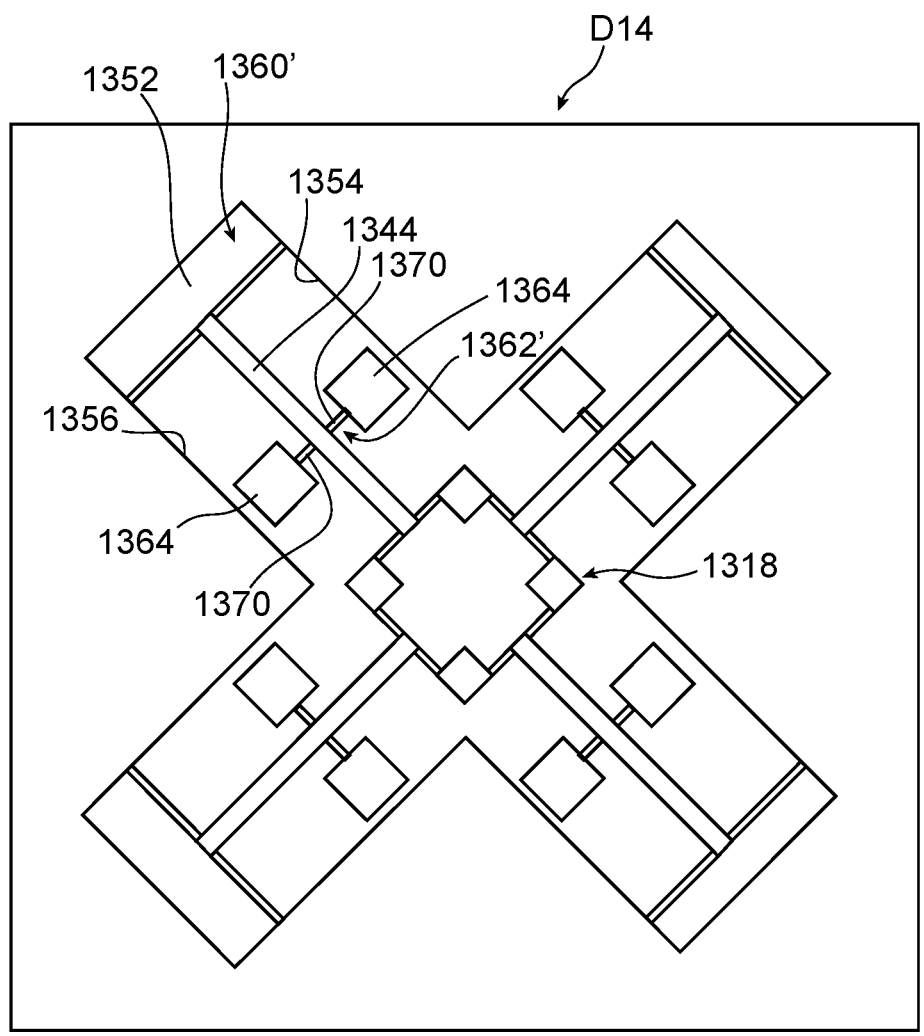
FIG. 19B is a view of a variant embodiment of the device in FIG. 19A.
Figure 20:
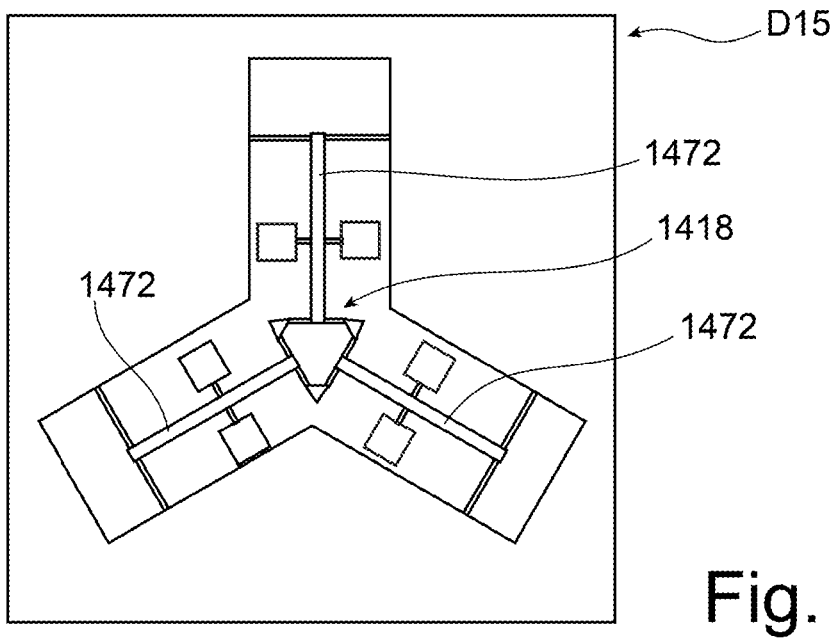
FIG. 20 is a view of a device using translation guiding means according to another example embodiment.

FIGS. 19A, 19B and 20 show a device according to another example embodiment in which the coupling means are within the outline of the mobile element.

On FIG. 19A, the device D13 comprises a mobile element 1304 provided with a window passing through the mobile element 1304 along the Z direction, for example made by etching and guiding means G5 located in the window 1342.

The guiding means G5 comprise four rigid arms 1344, 1346, 1348, 1350 articulated in rotation firstly on the mobile element, and secondly on the support and finally a coupling articulation 1318. The axes of the pivot articulations of each shaft are parallel to each other.

In the example shown, the window 1342 is in the form of a cross, the branches of which extend along diagonals of the rectangular shaped mobile element.

The relative arrangement of the arms is such that they form a cross corresponding to the window 1342.

The four arms are connected to the mobile element, to the support and to the coupling articulation in a similar manner, therefore only the arm connections 1344 will be described in detail.

The arm 1344 is located in a branch 1352 of the window 1342.

The branch 1352 comprises two side edges 1354, 1356 connected through a longitudinal edge 1358 positioned opposite the centre of the window.

The arm 1344 is connected to the mobile element 1304 through a pivot link 1360 between the lateral edge 1354 and a distal end 1344.1 of the arm.

The arm is connected to the support 1302 by a pivot link 1362 extending between a central zone of the arm and an anchor pad 1364 located between the side edge 1354 and the arm 1344. As a variant, the anchor pad can be located between the arm 1354 and the other lateral edge 1356. The arm 1344 is connected to the coupling articulation 1318 by its proximal end 1344.2. In the example shown, the coupling articulation 1318 comprises a frame composed of four beams 366 connected to each other through rigid connectors 1370.

The beams are capable of deforming in torsion. The proximal end 1344.1 of the arm 1344 is fixed to one of the beams 1366, such that the axis of the arm 1344 and the axis W1 of the beam 1366 are orthogonal. Thus, the link between the arms 1344 and the coupling articulation is a pivot link with axis W1.

The pivot links 1360 and 1362 are formed from beams that can be deformed in torsion.

The other arms 1344, 1346, 1348 and 1350 are articulated in rotation to the coupling articulation about axes W1, W2, W3, W4, the axes W1 and W3 being parallel to each other and perpendicular to axes W2 and W4 that are parallel to each other.

Out-of-plane displacement of the mobile element is enabled by the pivot links and transverse deformation of the coupling articulation, the beams 1366 having some degree of deformability in bending.

As a variant, the positions of the pivot links 1360 and 1362 could be inverted and/or located at different longitudinal positions on the arm 1344.

FIG. 19B shows a variant embodiment D14 of the device D13. The pivot link 1360' of the device D14 between the arm 1344 and the mobile element is formed by a beam extending between the two lateral edges 1354, 1356 of the branch of the window. The pivot link 1362' of the device D14 between the arm 1344 and the support comprises two beams 1370 extending on each side of the axis of the arm 1344 and each anchored on an anchor pad. The device D14 has an advantage over 013 in that the mass remains in place better. Forces are also symmetric.

As a variant, it would be possible for one of the pivot links 1354, 1356 to be as described for device D13 and the other of the pivot links 1356, 1354 to be as described for D14.

FIG. 20 shows another example embodiment D15, in which the guiding means G7 comprise three arms 1472 articulated on the mobile element and on the support in a manner similar to that described for devices D13 and D14. The arms are coupled together by a coupling articulation 1418 formed from a triangular frame comprising three beams deformable in torsion and forming pivot links between the arms and the coupling articulation.

The axes of the pivot links between firstly the arm and the mobile element, and secondly between the arm and the support, and finally between the arm and the coupling articulation are parallel to each other.

The device D15 has the advantage over devices D13 and D14 that its mass reduction is lower by using only three arms and having a lower resonant frequency, while providing retention in the two directions.

According to another example embodiment, the guiding means of devices D13 to D15 may comprise only two arms connected by a coupling articulation and located in a window passing through the mobile element.

Figure 21A:
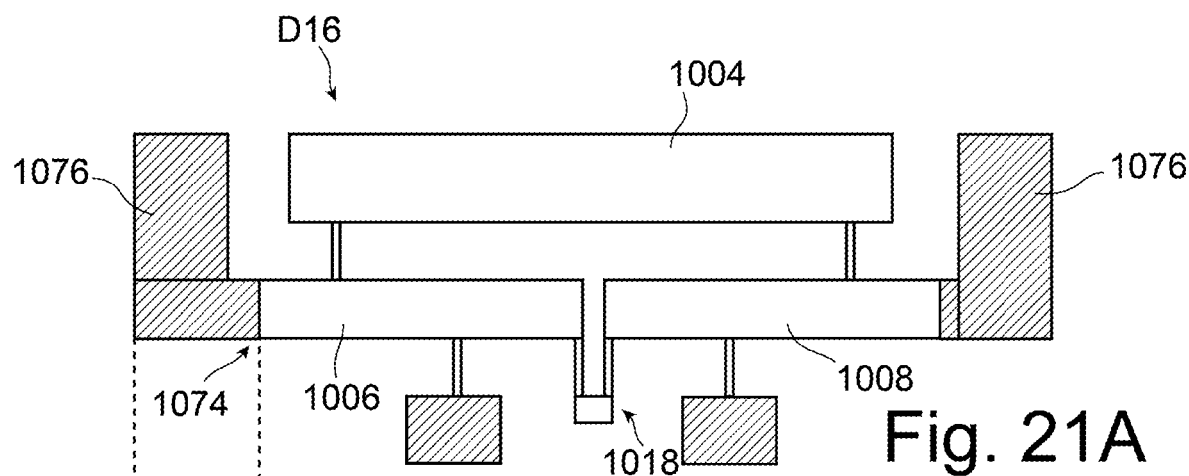
FIG. 21A is a top view of a device using translation guiding means according to the first example embodiment and also comprising out-of-plane stop means.
Figure 21B:
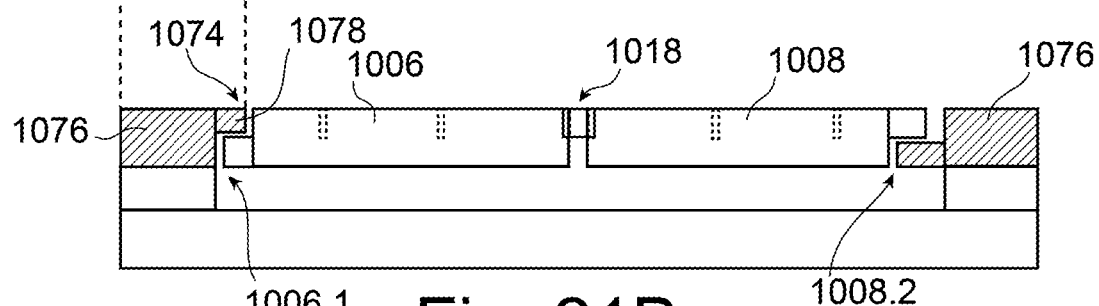
FIG. 21B is a side view of the device in FIG. 21A.
Figure 21C:
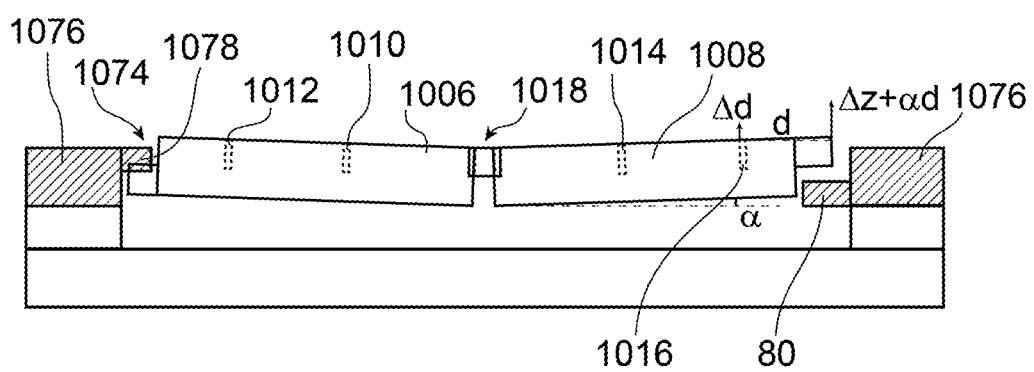
FIG. 21C shows a side view of the device in FIGS. 21A and 21B, in a stop state.

FIGS. 21A to 21C show an advantageous example of a device D16 according to the invention.

The structure of the device D16 is similar to the structure of device D9 and it also comprises out-of-plane stop means 1074.

The out-of-plane stop means are supported by the guiding means and also by the support.

The support comprises uprights 1076 located on the side edges of the guiding means on each side of the coupling articulation.

Advantageously, in the example shown, the out-of-plane stop means are two-directional. But it will be understood that the stop means could form a stop only in an out-of-plane displacement direction.

The pivot articulations between the arms and the mobile element are arranged such that the distal ends 1006.1 and 1008.2 project from these pivot articulations along the X direction.

One of the uprights 1076 comprises a lateral projection 1078 extending above the distal end 1006.1 of the arm 1006, considering the Z direction. Advantageously, the distal end 1006.1 is structured so that the structures can be brought closer together, reducing the overall size along the Z direction.

The other upright 1076 comprises a lateral projection 1080 extending below the distal end 1008.2 of the arm 1008, considering the Z direction. Advantageously, the distal end 1008.2 is structured.

On FIG. 21C, the distal end 1006.1 of the arm 1006 can be seen stopped in contact against the lateral projection 1078 of the upright 1076.

In this example and advantageously, the stop means come into action even before the mass comes into contact with the electrodes that will detect the displacement. As shown diagrammatically on FIG. 21C, if the mobile element moves a distance Δz along the Z direction away from the support, if the distance between the pivot link between the arm and the mobile element and the stop is equal to d, and the pivot angle of the arms is α, then the distal end 1006.1 moves by Δz+αd.

Advantageously, the surface area of the distal ends 1006.1, 1008.2 that might come into contact with the uprights 1076 is small, which reduces risks of sticking.

In other example embodiments, it could be envisaged that the two stops could be carried on the same arm, for example by structuring the arm.

Figure 19C:
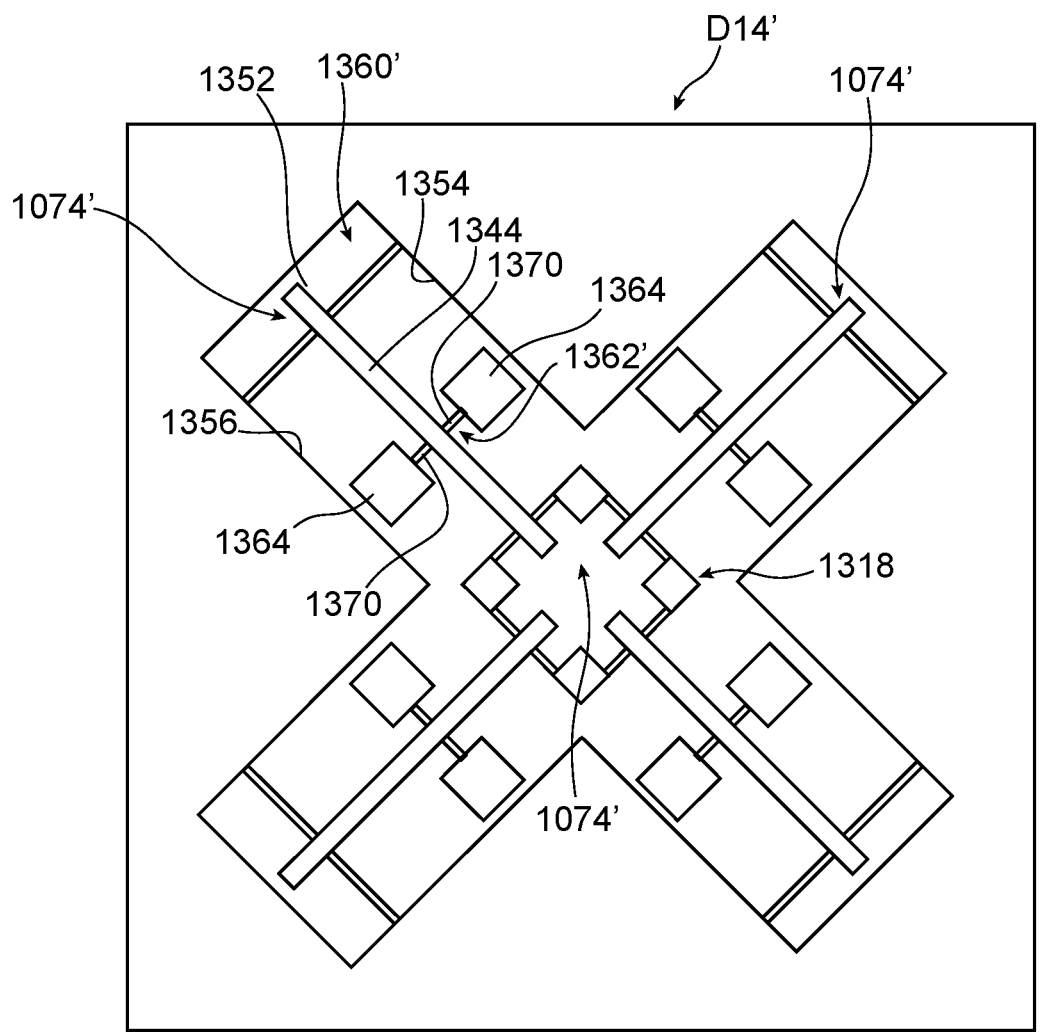
FIG. 19C is a view of the device in FIG. 19B comprising out-of-plane stop means.

FIG. 19C shows a variant embodiment D14' of the device D14 that comprises stop means 1074' formed by the longitudinal ends of the arms that are such that the axes of the pivot articulations 1360', 1362' are located at intermediate positions along the arms, rather than at the ends. Either one of the longitudinal ends of each arm stops in contact with the support depending on the displacement of the mobile part.

It will be understood that the out-of-plane stop means can apply to all devices D10 to D15 described above.

In the example in FIGS. 13 and 14A and 14B, the out-of-plane guiding means G1 are located external to the structure. As a variant, it can be envisaged to invert the suspension means and the guiding means, by arranging the guiding means between the mobile element and the anchor pad 1034, and by arranging the suspension mean externally.

The guiding means in FIGS. 13 to 17 could comprise more than two arms, for example four arms articulated to each other, on the mobile element and on the support.

Furthermore, in the case of a device comprising several guiding means according to the invention, the structures of the guiding means could be different.

We will now describe example methods of fabrication of a device according to the invention.

FIGS. 10A to 10I diagrammatically show the element obtained during different steps of a first example method of fabricating a device according to the invention. The device obtained is device D3. But it will be understood that the fabrication process could be used to make any device according to the invention.

A Silicon on Insulator (SOI) substrate 700 is used, for example 750 μm thick, comprising a silicon support 702, an $SiO_2$ layer 704 and a silicon layer 706, the oxide layer for example being 2 μm thick. This substrate is shown on FIG. 10A.

During a first step, the trenches 708 are made by etching the layer 706 stopping on the oxide layer 704, for example by Deep Reactive Ion Etching (DRIE), to delimit the mobile part and the anchor elements of the fixed part.

Figure 10A:
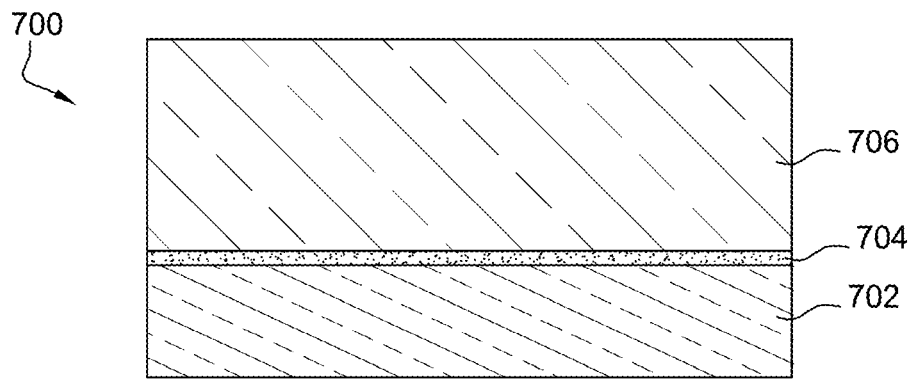
FIGS. 10A to 10I are diagrammatic views of steps in the fabrication of an example method of making the device according to the invention, FIG. 10G' is a diagrammatic view of a variant method of making electrodes by etching.
Figure 10B:
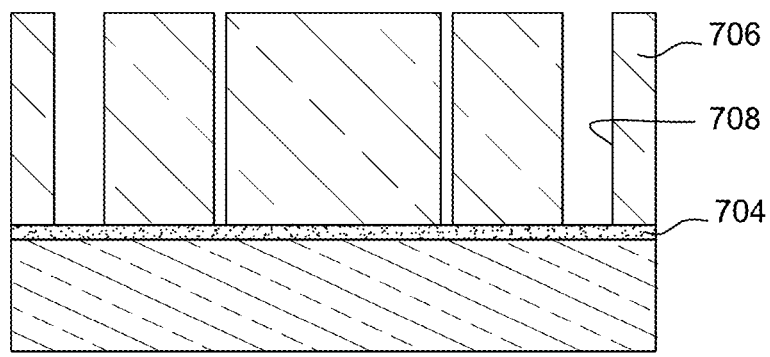

The element thus obtained is shown on FIG. 10B.

In a following step, the trenches 708 are closed for example with oxide 710. The oxidation can be formed by thermal oxidation, which has the effect of partially filling the trenches and/or by deposition of oxide over the entire surface of the substrate to cover the trenches. The oxide layer 710 covers the entire front face of the substrate. This step can be followed by mechanical-chemical polishing.

Figure 10C:
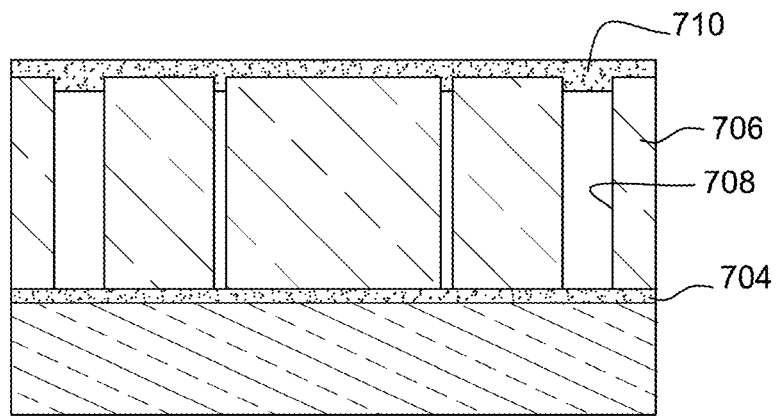

The element thus obtained is shown on FIG. 10C.

In a following step, the oxide layer 710 is structured to form accesses to the silicon layer 706 to enable the formation of mobile and fixed electrodes, and structuring may be achieved by Reactive Ion Etching (RIE). Structuring of the oxide layer 710 may also be done to make pivot links and stops. Structuring may be achieved by Reactive Ion Etching (RIE).

A thick silicon layer 712, for example between a few μM and a few tens of μm thick, is formed on the structured oxide layer, for example by epitaxial growth. Silicon is deposited in the accesses to the layer 706. As a variant, a conducting material different from the material for the substrate could form the layer 712.

Mechanical-chemical polishing can then take place.

The metallic pads and possibly the tracks are then made on the layer 712 by deposition and structuring.

Figure 10D:
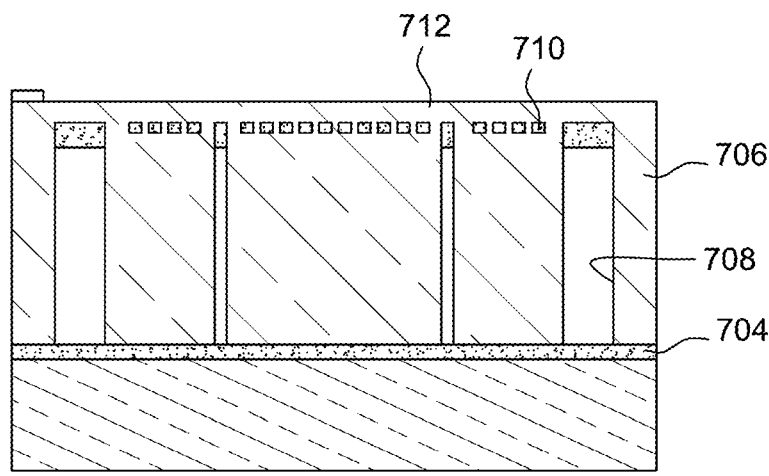

The element thus obtained is shown on FIG. 10D.

An oxide layer 714 is formed on the layer 712 during a following step, for example by deposition. This layer is then structured, for example by RIE etching. This structured layer will form a hard mask and will protect the zones of the layer 712.

Figure 10E:
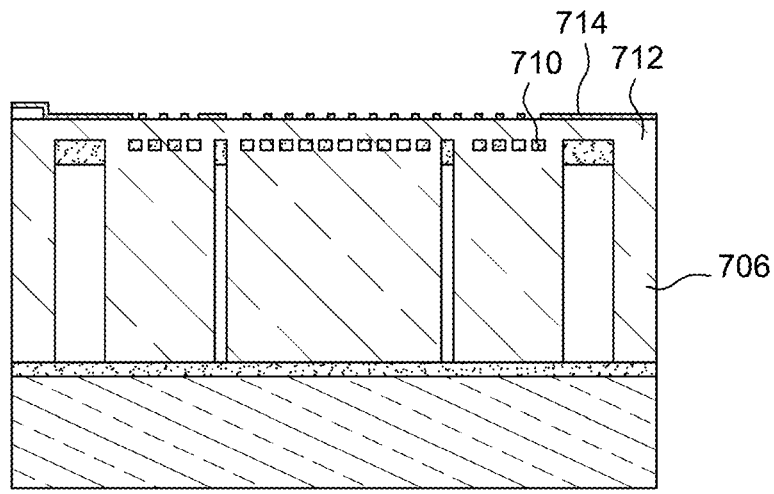

The element thus obtained is shown on FIG. 10E.

In a following step, a layer of photosensitive resin 716 is deposited and is structured to protect zones between zones covered with a hard mask that will be partially etched. Zones 718 between the hard mask 712 and the resin mask 716 remain accessible to an etching agent.

Figure 10F:
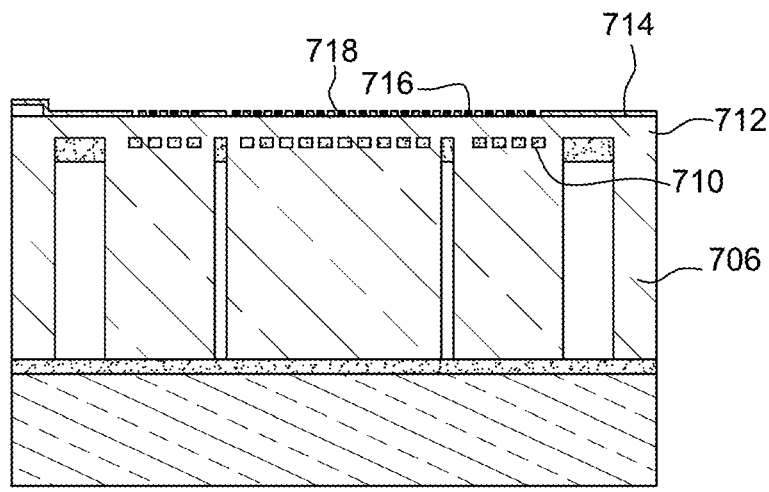

The element thus obtained is shown on FIG. 10F.

During a following step, accessible zones 718 of the layer 712 are etched, for example by DRIE. In the example shown, etching is done stopping on the layer 710.

Figure 10G:
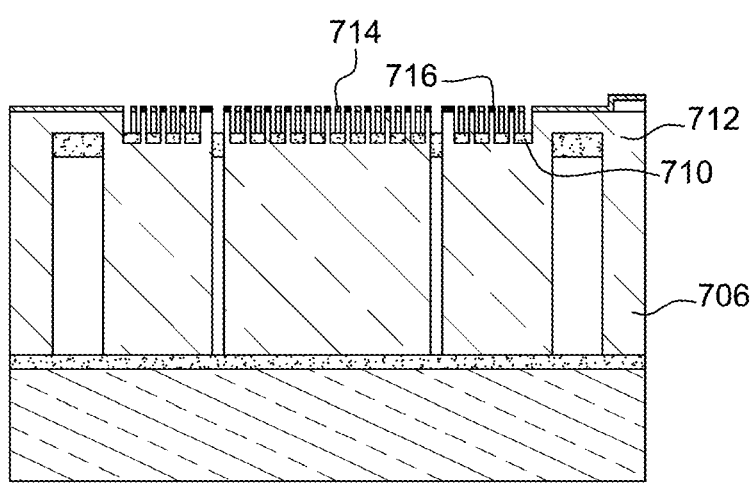
Figure 10G:
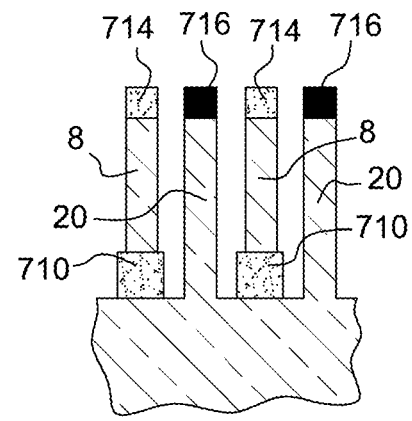

The element thus obtained is shown on FIG. 10G.

The arms and pivot links and the mobile element are at least partly delimited during structuring of the layer 712.

In this example, the mobile element and the guiding means are made in a single piece. In another example, the guiding means can be made in the layer 706, in this case the mobile element and the guiding means are not made in a single piece.

According to another particularly advantageous embodiment, etching is stopped on layer 710 to make the suspended electrodes 8, this etching (FIG. 2) is stopped in time to make the electrodes 20. To achieve this, the layer 710 is structured in the step shown in FIG. 10D) such that, as seen in section, the width of portions of the layer 710 remaining after etching is less than the distance separating the electrodes 20 as shown on FIG. 10G'. Thus, the flanks of the electrodes 20 are obtained solely by time-controlled etching and are plane. This thus avoids a risk of misalignment between the masks and the portions 710. Time-controlled etching stops between portions or islands of the layer 710 or beyond along the etching progression direction.

During a following step, the resin layer 716 is removed and partial etching of the layer 712 is made in line with former locations of the resin 716. The mobile and fixed electrodes are then made partially facing each other. Partial etching may for example be a time-controlled etching.

Figure 10H:
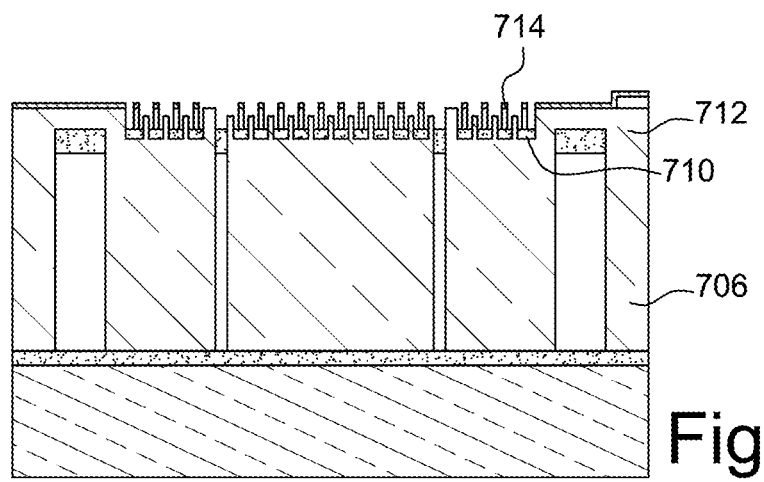

The element thus obtained is shown on FIG. 10H.

During a following step, the structure is released by etching the oxide 710 and the oxide 704 for example with gaseous hydrofluoric acid through passages in the structure (not shown). This is a time-controlled etching.

Figure 10I:
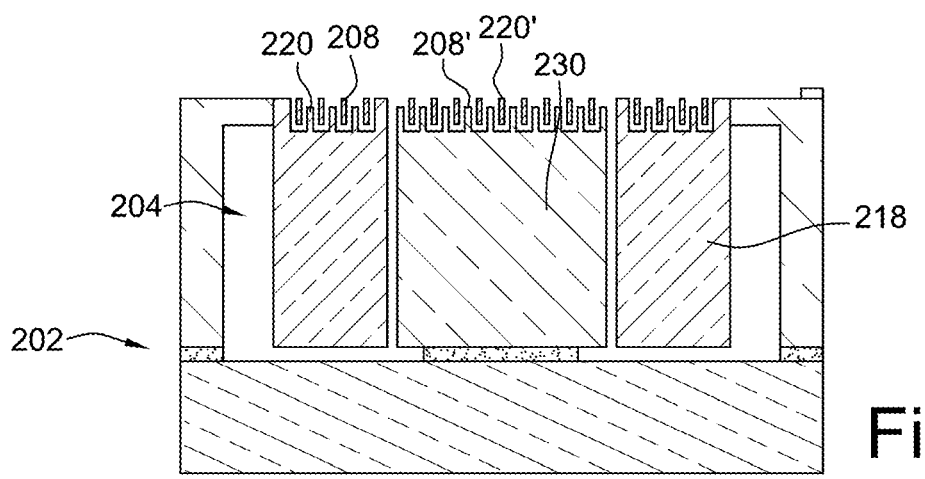

The element thus obtained is shown on FIG. 10I.

Another example of a fabrication method will be described with reference to FIGS. 11A to 11I. This example method has the advantage that it does not use an SOI substrate, thus reducing the cost price. Furthermore, the thickness of the mobile part, and particularly the mass, can be chosen.

Secondly, a first substrate 800 made of a conducting or semiconducting material is used, for example made of silicon, for example 750 µm thick.

A sacrificial layer 802 is formed during a first step, for example by depositing for example an oxide with a thickness for example of 3µm, on one of the faces of the substrate 800.

Figure 11A:
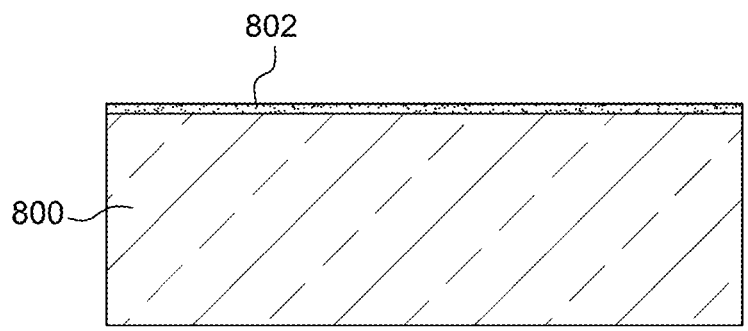
FIGS. 11A to 11I are diagrammatic views of steps in the fabrication of another example method of making the device according to the invention.

The element is shown on FIG. 11A.

The following steps are similar to the steps associated with FIGS. 10D to 10G, forming a silicon layer 804 and an oxide layer 806. The fixed and mobile electrodes are structured.

Figure 11B:
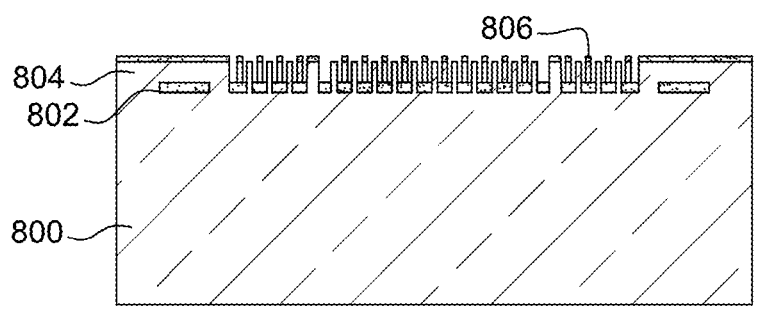

This element thus obtained is shown on FIG. 11B.

An etching step is performed during a following step, similar to the partial etching of silicon pins as described with reference to FIG. 10H.

Figure 11C:
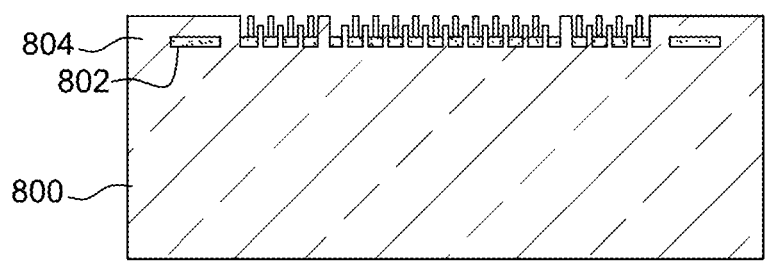

The element designated El thus obtained is shown on FIG. 11C.

Moreover, a second conducting or semiconducting substrate 810 is used, typically 750 µm thick, in which a cavity 812 is etched on the front face and metallic pads 814 are formed on the front face.

Figure 11D:
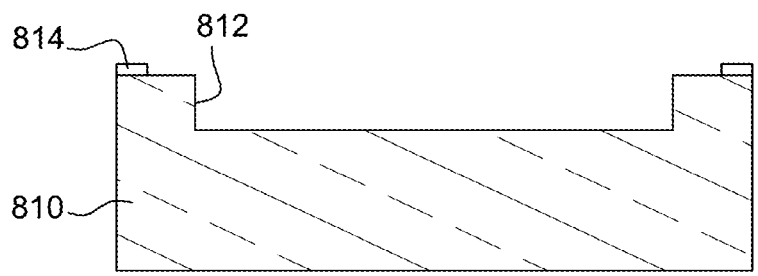

The element designated E2 thus obtained is shown on FIG. 11D.

During a following step, the elements E1 and E2 are bonded by eutectic bonding using pads 814 such that the electrodes are facing the cavity 812. Direct bonding could be envisaged as a variant.

Figure 11E:
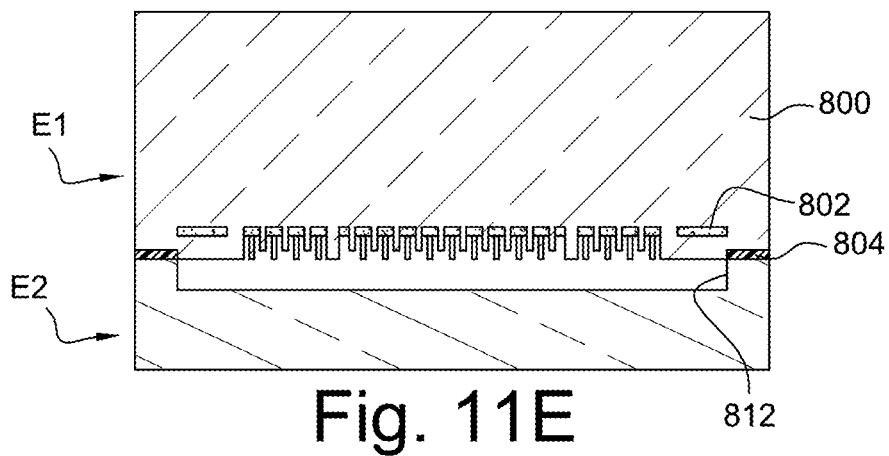

The element thus obtained is shown on FIG. 11E.

During a following step, the first substrate 800 is thinned for example by grinding and then chemical-mechanical polishing, or by RIE etching and then CMP and electrical contacts are made on the back face.

Figure 11F:
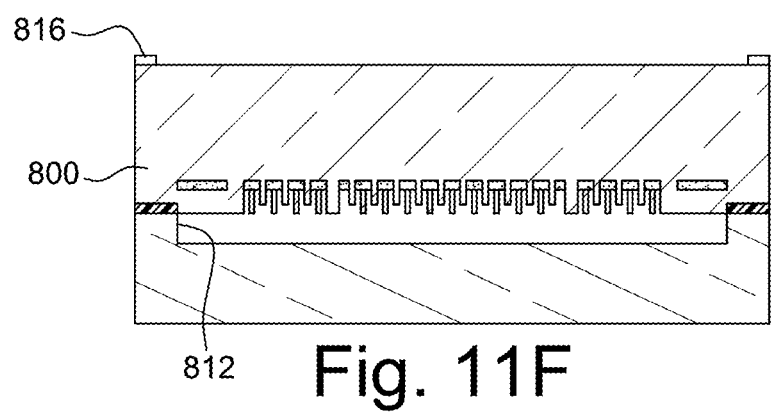

The element thus obtained is shown on FIG. 11F.

During a following step, the substrate 800 is structured to define the mobile part and anchor elements, for example by etching the substrate 800 over its entire thickness stopping on the layer 802, for example by DRIE.

Figure 11G:
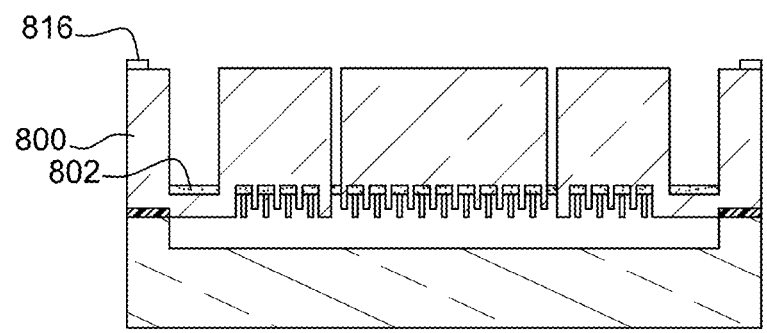

The element thus obtained is shown on FIG. 11G.

During a following step, the structure is released by etching the oxide layer 802, for example using gaseous hydrofluoric acid.

Figure 11H:
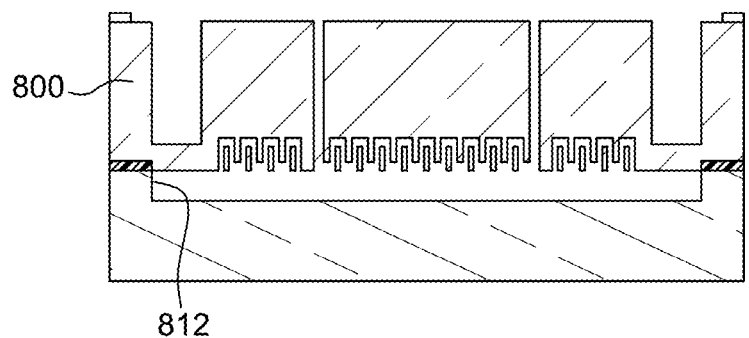

The element thus obtained is shown on FIG. 11H.

Optionally, a cover 808 can be added to encapsulate the device, for example by bonding, such as polymer sealing or eutectic sealing.

Figure 11I:
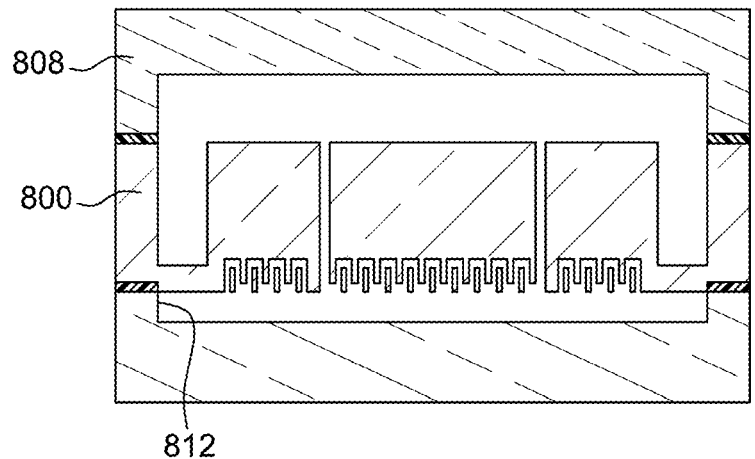
Figure 12:
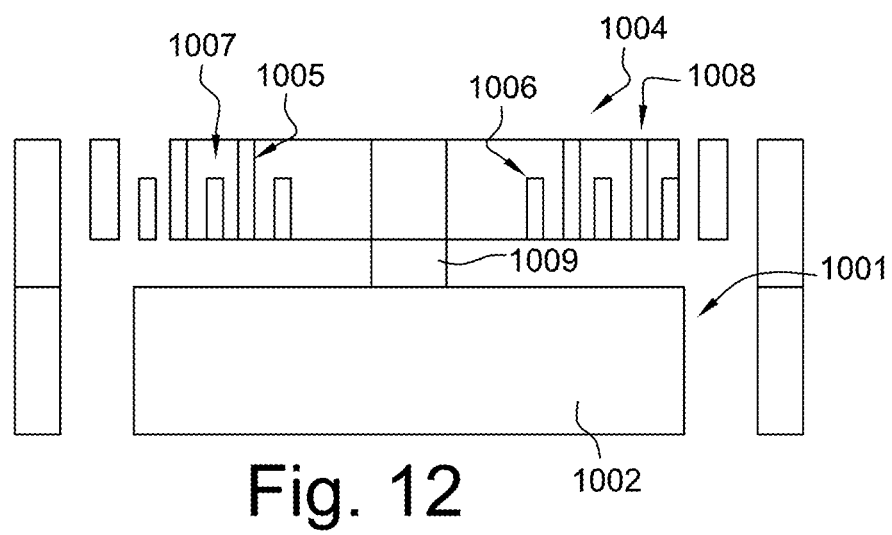
FIG. 12 is a diagrammatic view of an accelerometer according to the state of the art.

The element thus obtained is shown on figure 11I.

The method illustrated in FIGS. 11A to 11I is particularly well adapted to making an actuator for a micro-mirror. The mirror can easily be made at the back of the substrate 800.

Therefore, the device according to the invention provides detection or actuation electrodes with surface area variation with out-of-plane displacement, with linear, two-directional electromechanical transduction. Detection may advantageously be differential. The device also enables high capacitive density, high detection sensitivity and a large actuation force while using low voltages. For example, in the case of MEMS micromirrors, the entire back face of the mirror support can comprise electrodes, and the filling factor can be maximised to reduce the surface area used for actuation and reduce production costs.

The invention makes it possible to optimise firstly the mechanical part, the mass in the case of an inertial sensor or the actuator part such as the surface of the mirror, and secondly the capacitive part used for detection and/or actuation.

The device can also advantageously be used to make a gyrometer.

The invention claimed is:

1. A microelectromechanical and/or nanoelectromechanical device comprising:
   at least two assemblies including a first assembly and a second assembly, wherein
   the first assembly comprises at least one first part and at least one second part free to move relative to each other at least in an out-of-plane displacement direction,
   the second assembly comprises at least one third part and at least one fourth part free to move relative to each other at least in the out-of-plane displacement direction,
   the first part comprises a first support and at least first electrodes extending parallel to the out-of-plane displacement direction,
   the second part comprises a second support and at least second electrodes extending parallel to said out-of-plane displacement direction,
   the third part comprises a third support and at least third electrodes extending parallel to the out-of-plane displacement direction,
   the fourth part comprises a fourth support and at least fourth electrodes extending parallel to said out-of-plane displacement direction,
   the first electrodes and the second electrodes are arranged relative to each other such that they are interdigitated,
   the third electrodes and the fourth electrodes are arranged relative to each other such that they are interdigitated,
   the second support comprises at least one face perpendicular to the out-of-plane displacement direction,
   the fourth support comprises at least one face perpendicular to the out-of-plane displacement direction,
   the first electrodes each comprise a first end and a second end in the out-of-plane displacement direction, the second electrodes each comprise a first end and a second end in the out-of-plane displacement direction, the third electrodes each comprise a first end and a second end in the out-of-plane displacement direction, the fourth electrodes each comprise a first end and a second end in the out-of-plane displacement direction, the second ends of the second electrodes are directly connected to the face of the second support and a first end of the second electrodes is located between two ends of the first electrodes such that only part of a face of each of the second electrodes is facing a first electrode at rest, the second ends of the fourth electrodes are directly connected to the face of the fourth support and a first end of the fourth electrodes is located between two ends of the third electrodes such that only part of a face of each of the second electrodes is facing a third electrode at rest, the first part of the first assembly is mechanically connected to the fourth part of the second assembly and the second part of the first assembly is mechanically connected to the third part of the second assembly, one of the first and second parts forms a first inertial mass, one of the third and fourth parts comprises a set of second inertial masses, and the set of second inertial masses surrounds the first inertial mass in a plan view in the out-of-plane displacement direction.

2. The device according to claim 1, wherein one of said first or second parts is mobile and the other of said first or second parts is fixed, and one of said third or fourth parts is mobile and the other of said third or fourth parts is fixed, or said first and second parts are both mobile and displaced relative to each other, and said third and fourth parts are both mobile and displaced relative to each other.

3. The device according to claim 1, wherein one of said first or second parts is mobile and the other of said first or second parts is fixed, and one of said third or fourth parts is mobile and the other of said third or fourth parts is fixed.

4. The device according to claim 1, wherein a part of the first support forms an inertial mass which is suspended from the second part, a part of the second support forms an inertial mass which is suspended from the first part, a part of the third support forms an inertial mass which is suspended from the fourth part, or a part of the fourth support foil is an inertial mass which is suspended from the third part.

5. The device according to claim 1, wherein the first part of the first assembly and the fourth part of the second assembly are electrically insulated from each other, and/or the second part of the first assembly and the third part of the second assembly are electrically insulated from each other.

6. The device according to claim 1, wherein the second support of the first assembly and the fourth support of the second assembly are located on one side of a plane perpendicular to the out-of-plane displacement direction, and the first support of the first assembly and the third support of the second assembly are located on another side of said plane.

7. The device according to claim 6, wherein the second support forming an inertial mass of the first assembly comprises four housings to house four fourth supports of the second assembly, the second electrodes of the first assembly form a cross between the four housings, and the second assembly comprises four third supports suspended from the second support of the first assembly.

8. The device according to claim 1, wherein a cross-section of the first electrodes and the second electrodes are such that the first or the second electrodes continuously surround the second or first electrodes respectively, and a cross-section of the third electrodes and the fourth electrodes are such that the third or the fourth electrodes continuously surround the fourth or third electrodes respectively.

9. The device according to claim 1, further comprising:

at least one guiding means guiding the first part or the second part along the out-of-plane displacement direction.

10. The device according to claim 9, wherein the guiding means guides the first part or the second part in translation, the guiding means comprises at least two rigid arms extending in a longitudinal direction, a first pivot articulation between each of the rigid arms and the first part or the second part, a second pivot articulation between each of the rigid arms and a support, and a coupling articulation between the two rigid arms comprising at least one third pivot articulation, at least two of the first through third pivot articulations connected to each of the rigid arms have a degree of freedom in translation in a plane of the device along the rigid arms, and said first through third pivot articulations have rotation axes at least parallel to each other such that, during translational displacement of the first part or the second part, the rigid arms pivot relative to each other in opposite directions.

11. The device according to claim 10, wherein the least two of the first through third pivot articulations having the degree of freedom in translation in the plane of the device along the rigid aims comprise at least one beam that can be deformed in torsion.

12. The device according to claim 9, wherein the guiding means is located at least along one external edge of a mobile element.

13. The device according to claim 9, further comprising at least two guiding means, wherein rotation axes of the two guiding means intersect each other.

14. A capacitive detection device comprising at least one device according to claim 1.

15. An actuator comprising at least one device according to claim 1.

16. The actuator according to claim 15, wherein the mobile parts are suspended from the fixed parts by a pivot articulation.

17. A micromirror device comprising at least one actuator according to claim 15, wherein the second part and/or the fourth part are mobile, the second support and/or the fourth support comprises a second face opposite the face, and the second face comprises a reflecting surface forming a mirror.

18. A gyrometer comprising at least one device according to claim 1 forming an actuator and/or a detection device.

19. A method of manufacturing the device according to claim 1, starting from a first substrate comprising at least one first layer made of a thick electrically conducting material, comprising:
   a) forming a first sacrificial layer on the first layer made of the electrically conducting material,
   b) forming first trenches in the first sacrificial layer as far as the first layer made of the electrically conducting material so as to form islands of a second sacrificial layer,
   c) forming a second layer of an electrically conducting material on the first sacrificial layer and in the first trenches,
   d) structuring said second layer made of the electrically conducting material so as to form second trenches at least partly opening up on the islands of the second sacrificial layer, thus forming elements comprising first portions of the second layer of the electrically conducting material in contact with the first layer of the electrically conducting material that will form the second electrodes and second portions of the second layer of the electrically conducting material in contact with the islands of the second sacrificial layer that will form the first electrodes,
   e) partial etching of the first portions,
   f) releasing the device.

20. The method according to claim 19, wherein in step d), the first electrodes are formed by etching stopped on the islands of the second sacrificial layer and the second electrodes are formed by said etching stopped in time between the islands of the second sacrificial layer or beyond in a direction of etching.

21. The method according to claim 19, wherein step d) comprises forming a hard mask on the second layer of the electrically conducting material, structuring said hard mask at locations of the second portions, and forming a mask made of a photosensitive resin at locations of the first portions.

22. The method according to claim 19, wherein step c) comprises epitaxial growth.

23. The method according to claim 19, further comprising a step between step e) and step f) including fabricating a second substrate provided with a cavity, assembling the second substrate with the first substrate such that the first and second portions are facing the cavity, and fabricating third trenches in the first substrate starting from a back face and as far as the first sacrificial layer so as to delimit a mobile part.

24. The method according to claim 23, further comprising a step to assemble a cover on the second substrate.

25. The method according to claim 19, wherein
   the first substrate is a silicon on insulator substrate,
   the fabrication method further comprises a step before the step a) including forming fourth trenches in the first layer made of the electrically conducting material as far as an oxide layer in the first substrate so as to delimit a mobile part, and
   in step a), the first sacrificial layer is formed on the first layer made of the electrically conducting material so as to cover the first layer made of the electrically conducting material and to at least close off the fourth trenches.

26. The device according to claim 1, wherein
   the first support and/or the third support includes a plurality of bars that form a grid, and
   the plurality of bars of the first support constitute the first electrodes and/or the plurality of bars of the third support constitute the third electrodes.

27. A microelectromechanical and/or nanoelectromechanical device comprising:
   at least two assemblies including a first assembly and a second assembly, wherein
   the first assembly comprises at least one first part and at least one second part free to move relative to each other at least in an out-of-plane displacement direction,
   the second assembly comprises at least one third part and at least one fourth part free to move relative to each other at least in the out-of-plane displacement direction,
   the first part comprises a first support and at least first electrodes extending parallel to the out-of-plane displacement direction,
   the second part comprises a second support and at least second electrodes extending parallel to said out-of-plane displacement direction,
   the third part comprises a third support and at least third electrodes extending parallel to the out-of-plane displacement direction,
   the fourth part comprises a fourth support and at least fourth electrodes extending parallel to said out-of-plane displacement direction,
   the first electrodes and the second electrodes are arranged relative to each other such that they are interdigitated,
   the third electrodes and the fourth electrodes are arranged relative to each other such that they are interdigitated,
   the second support comprises at least one face perpendicular to the out-of-plane displacement direction,
   the fourth support comprises at least one face perpendicular to the out-of-plane displacement direction,
   the first electrodes each comprise a first end and a second end in the out-of-plane displacement direction,
   the second electrodes each comprise a first end and a second end in the out-of-plane displacement direction,
   the third electrodes each comprise a first end and a second end in the out-of-plane displacement direction,
   the fourth electrodes each comprise a first end and a second end in the out-of-plane displacement direction,
   the second ends of the second electrodes are directly connected to the face of the second support and a first end of the second electrodes is located between two ends of the first electrodes such that only part of a face of each of the second electrodes is facing a first electrode at rest,
   the second ends of the fourth electrodes are directly connected to the face of the fourth support and a first end of the fourth electrodes is located between two ends of the third electrodes such that only part of a face of each of the second electrodes is facing a third electrode at rest,
   the first part of the first assembly is mechanically connected to the fourth part of the second assembly and the second part of the first assembly is mechanically connected to the third part of the second assembly, and
   the second electrodes of the second part form a cross shape and divide the second support into a plurality of housings each comprising a fourth support for the second assembly.

* * * * *